(12) United States Patent
Kang et al.

(10) Patent No.: US 10,295,149 B2
(45) Date of Patent: May 21, 2019

(54) OPTICAL LENS, LIGHTING MODULE, AND LIGHT UNIT COMPRISING SAME

(71) Applicant: LG INNOTEK CO., LTD., Seoul (KR)

(72) Inventors: Min Soo Kang, Seoul (KR); Yun Ho Shin, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/576,794

(22) PCT Filed: May 24, 2016

(86) PCT No.: PCT/KR2016/005491
§ 371 (c)(1),
(2) Date: Nov. 24, 2017

(87) PCT Pub. No.: WO2016/190651
PCT Pub. Date: Dec. 1, 2016

(65) Prior Publication Data
US 2018/0306406 A1    Oct. 25, 2018

(30) Foreign Application Priority Data

May 26, 2015    (KR) .................. 10-2015-0072829

(51) Int. Cl.
*F21V 5/04*    (2006.01)
*G02B 3/00*    (2006.01)
(Continued)

(52) U.S. Cl.
CPC .............. *F21V 5/046* (2013.01); *F21V 5/007* (2013.01); *F21V 5/04* (2013.01); *F21V 5/08* (2013.01);
(Continued)

(58) Field of Classification Search
CPC ...... F21V 5/046; F21V 5/007; H01L 25/0753; H01L 33/58
(Continued)

(56) References Cited

U.S. PATENT DOCUMENTS 8,563,992 B2    10/2013    Kato et al.
8,833,979 B2 *    9/2014    Wang .................. F21V 5/04
362/311.01
(Continued)

FOREIGN PATENT DOCUMENTS

EP    1 653 254    5/2006
EP    2 668 442    12/2013
(Continued)

OTHER PUBLICATIONS

International Search Report (with English Translation) and Written Opinion dated Sep. 19, 2016 issued in Application No. PCT/KR2016/005491.
(Continued)

*Primary Examiner* — Laura K Tso
(74) *Attorney, Agent, or Firm* — Ked & Associates, LLP

(57) ABSTRACT

A lighting module includes a circuit board of which length in a direction of a first axis is longer than that in a direction of a second axis; a plurality of optical lenses arranged in the direction of the first axis on the circuit board; and at least one light emitting device respectively disposed between the circuit board and the plurality of optical lenses, wherein the optical lens includes: an incident surface disposed on the circuit board; a first light output surface upwardly emitting light incident through the incident surface; a second light output surface emitting the incident light in a lateral direction; and a side protruding part protruding outward from a
(Continued)

first region of the second light output surface, wherein the side protruding part of each of the optical lenses protrudes outward of the circuit board.

19 Claims, 18 Drawing Sheets

(51) Int. Cl.
| | | |
|---|---|---|
| F21V 5/00 | (2018.01) | |
| F21V 17/06 | (2006.01) | |
| G02B 19/00 | (2006.01) | |
| F21V 5/08 | (2006.01) | |
| F21Y 115/10 | (2016.01) | |
| H01L 25/075 | (2006.01) | |
| H01L 33/58 | (2010.01) | |
| H01L 33/62 | (2010.01) | |
| F21Y 105/10 | (2016.01) | |
| F21Y 103/10 | (2016.01) | |

(52) U.S. Cl.
CPC ............... *F21V 17/06* (2013.01); *G02B 3/00* (2013.01); *G02B 19/0066* (2013.01); *F21Y 2103/10* (2016.08); *F21Y 2105/10* (2016.08); *F21Y 2115/10* (2016.08); *H01L 25/0753* (2013.01); *H01L 33/58* (2013.01); *H01L 33/62* (2013.01)

(58) Field of Classification Search
USPC ................................. 362/249.02, 311.02, 240
See application file for complete search history.

(56) References Cited

U.S. PATENT DOCUMENTS

| | | | |
|---|---|---|---|
| 8,939,618 | B2 | 1/2015 | Kawahara et al. |
| 9,121,555 | B2* | 9/2015 | Hwang ..................... F21V 7/05 |
| 2006/0083000 | A1 | 4/2006 | Yoon et al. |
| 2011/0013393 | A1 | 1/2011 | Ishio et al. |
| 2013/0007542 | A1 | 1/2013 | Carman et al. |
| 2013/0051030 | A1* | 2/2013 | Lee .......................... F21V 5/04 |
| | | | 362/311.02 |
| 2013/0148333 | A1* | 6/2013 | Ha ................... G02F 1/133603 |
| | | | 362/97.2 |
| 2013/0301264 | A1 | 11/2013 | Van Gompel |
| 2014/0009944 | A1 | 1/2014 | Fukuda |
| 2014/0218909 | A1 | 8/2014 | Tetsuo et al. |
| 2015/0003053 | A1 | 1/2015 | Ariyoshi et al. |
| 2015/0036353 | A1 | 2/2015 | Kim et al. |

FOREIGN PATENT DOCUMENTS

| | | |
|---|---|---|
| JP | 2011-003549 | 1/2011 |
| KR | 10-2011-0006623 | 1/2011 |
| KR | 10-2013-0068495 | 6/2013 |
| KR | 10-2013-0094482 | 8/2013 |
| KR | 10-2014-0099399 | 8/2014 |
| KR | 10-2015-0008959 | 1/2015 |
| WO | WO 2012/101547 | 8/2012 |

OTHER PUBLICATIONS

European Search Report dated Nov. 12, 2018 issued in Application No. 16800290.5.

* cited by examiner

OPTICAL LENS, LIGHTING MODULE, AND LIGHT UNIT COMPRISING SAME

CROSS-REFERENCE TO RELATED PATENT APPLICATIONS

This application is a U.S. National Stage Application under 35 U.S.C. § 71 of PCT Application No. PCT/KR2016/005491, filed May 24, 2016, which claims priority to Korean Patent Application No. 10-2015-0072829, filed May 26, 2015, whose entire disclosures are hereby incorporated by reference.

TECHNICAL FIELD

The present disclosure relates to an optical lens, a lighting module, and a light unit having the same.

BACKGROUND ART

A light emitting device, e.g., a light emitting diode (LED) is a kind of semiconductor device that converts electrical energy into light. The light emitting device has come into the spotlight as a next-generation light source that substitutes for the existing fluorescent lamps and incandescent lamps.

The LED generates light using a semiconductor device. Thus, the LED consumes very low power as compared with the incandescent lamp that generates light by heating tungsten or the fluorescent lamp that generates light by allowing ultraviolet light generated through high-voltage discharge to collide with a fluorescent substance.

Also, the LED generates light using a potential gap of the semiconductor device. Thus, the LED has a long lifespan, a fast response speed, and an eco-friendly property, as compared with the existing light sources.

Accordingly, a lot of research for replacing the existing light sources with LEDs has been conducted. The LEDs have been increasingly used as light sources of lighting devices such as various lamps, display devices, electronic display boards, and streetlamps.

DISCLOSURE

Technical Problem

Embodiments provide a lighting module in which a side protruding part of an optical lens disposed on a circuit board is disposed outward of a side of the circuit board.

Embodiments provide a lighting module in which side protruding parts of a plurality of optical lenses disposed on a circuit board are disposed outward of at least one side or both sides of the circuit board.

Embodiments provide a lighting module in which cutting surfaces of side protruding parts of a plurality of optical lenses disposed on a circuit board are disposed in parallel to a side of the circuit board in a direction of a first axis.

Embodiments provide a lighting module in which side protruding parts of a plurality of optical lenses are arranged in a direction in which the distance between the plurality of optical lenses becomes wider.

Embodiments provide a lighting module in which the distance between optical lenses on first and second circuit boards is formed wider than the distance between optical lenses disposed on the first circuit board.

Embodiments provide a lighting module in which the direction of a side protruding part of an optical lens is a direction perpendicular to a line connecting two support protrusions adjacent to the side protruding part or is disposed within 30 degrees from an axis perpendicular thereto.

Embodiments provide a lighting module in which a side protruding part of an optical lens protrudes outward of an emission surface of the optical lens.

Embodiments provide an optical lens in which peaks of an incident surface and a first light output surface are convex in the same direction, and a lighting module having the optical lens.

Embodiments provide an optical lens in which a peak of an incident surface is more adjacent to a peak of a first light output surface than a light source, and a lighting module having the optical lens.

Embodiments provide an optical lens having a spherical first light output surface and an inclined aspherical second light output surface around an incident surface, and a lighting module having the optical lens.

Embodiments provide an optical lens having an inclined or curved bottom surface around a light emitting device, and a lighting module having the optical lens.

Embodiments provide an optical lens which changes the emission angle of light incident from a light emitting device emitting light through at least five surfaces, and a lighting module having the optical lens.

Embodiments provide an optical lens in which the emission angle of light emitted into a region out of a directional angular distribution of the light is smaller than the incident angle of the light, and a lighting module having the optical lens.

Technical Solution

In an embodiment, a lighting module includes: a circuit board of which length in a direction of a first axis is longer than that in a direction of a second axis; a plurality of optical lenses arranged in the direction of the first axis on the circuit board; and at least one light emitting device respectively disposed between the circuit board and the plurality of optical lenses, wherein the optical lens includes: an incident surface disposed on the circuit board; a first light output surface upwardly emitting light incident through the incident surface; a second light output surface emitting the incident light in a lateral direction; and a side protruding part protruding outward from a first region of the second light output surface, wherein the side protruding part of each of the optical lenses protrudes outward of the circuit board.

In An embodiment, a lighting module includes: a plurality of circuit boards, each of which length in a direction of a first axis is longer than that in a direction of a second axis; a plurality of optical lenses arranged in the direction of the first axis on the plurality of circuit boards; and at least one light emitting device respectively disposed between the circuit board and the plurality of optical lenses, wherein the optical lens includes: an incident surface disposed on the circuit board; a first light output surface upwardly emitting light incident through the incident surface; a second light output surface emitting the incident light in a lateral direction; and a side protruding part protruding outward from a first region of the second light output surface, wherein the side protruding part of each of the optical lenses protrudes outward of a side of the circuit board, the plurality of circuit boards include first and second circuit boards arranged in the direction of the second axis, and the distance between the optical lenses arranged on the first or second circuit board is narrower than the minimum distance between the optical lenses arranged on the first and second circuit boards.

In an embodiment, a light unit includes an optical sheet on the lighting module.

Advantageous Effects

According to the present disclosure, it is possible to reduce light interference between adjacent optical lenses.

According to the present disclosure, it is possible to reduce interference between optical lenses on different circuit boards.

According to the present disclosure, the path of light emitted through side surfaces of a light emitting device disposed under an optical lens is controlled, thereby improving the brightness distribution of the optical lens.

According to the present disclosure, it is possible to noise such as a hot spot caused by light emitted from an optical lens.

According to the present disclosure, the distance between light emitting devices is widely provided by optical lenses, thereby reducing interference between the optical lenses.

According to the present disclosure, it is possible to decrease the number of light emitting devices arranged in the light unit.

According to the present disclosure, it is possible to improve the reliability of the lighting module having optical lenses.

According to the present disclosure, it is possible to minimize interference between adjacent optical lenses, thereby improving image quality.

According to the present disclosure, it is possible to improve the reliability of the light unit such as the optical lens.

According to the present disclosure, it is possible to improve the reliability of the lighting system having the lighting module.

Figure 11:
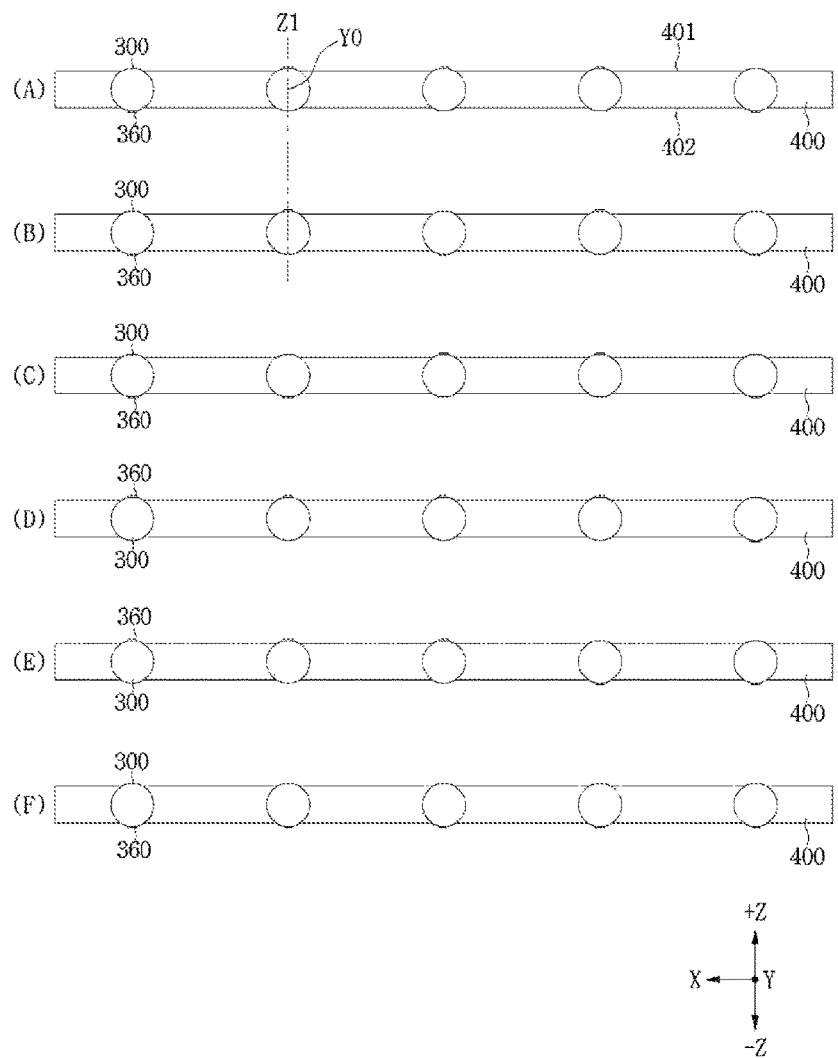

(A) to (F) of FIG. 11 are views showing cases where optical lenses are arranged on each circuit board in a lighting module according to an embodiment.

Figure 12:
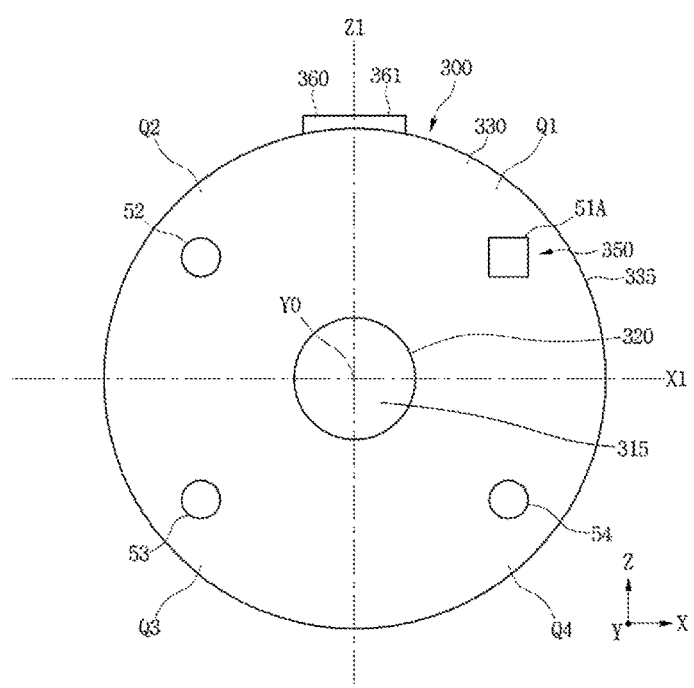

FIG. 12 is a rear view showing another example of the optical lens according to an embodiment.

Figure 13:
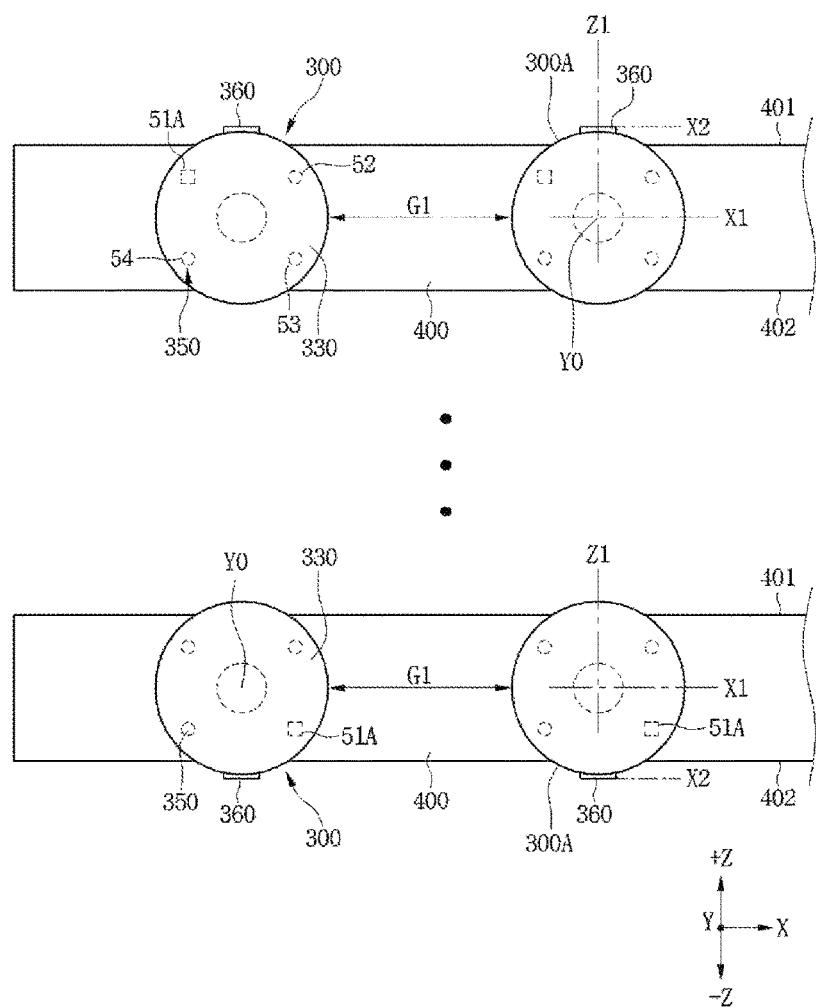

FIG. 13 is a plan view showing a lighting module having the optical lens of FIG. 12.

Figure 14:
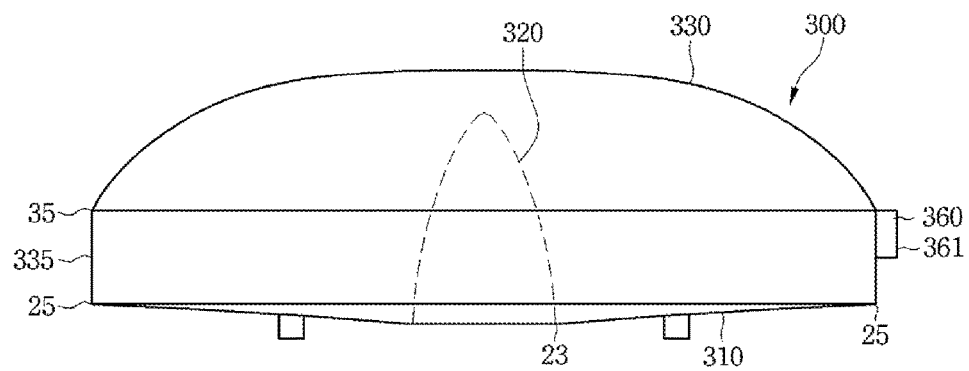

FIG. 14 is a side view showing an example of the optical lens according to an embodiment.

Figure 1:
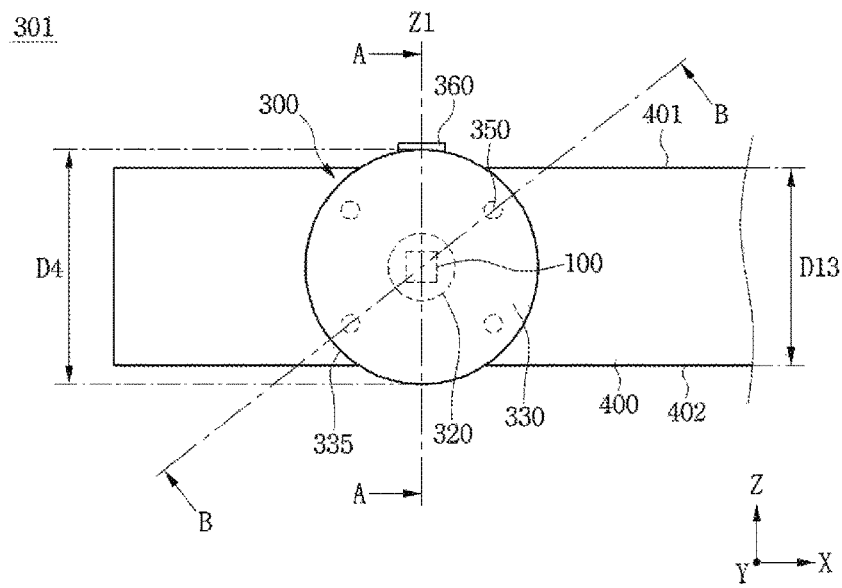
FIG. 1 is a plan view of a lighting module according to an embodiment.
Figure 15:
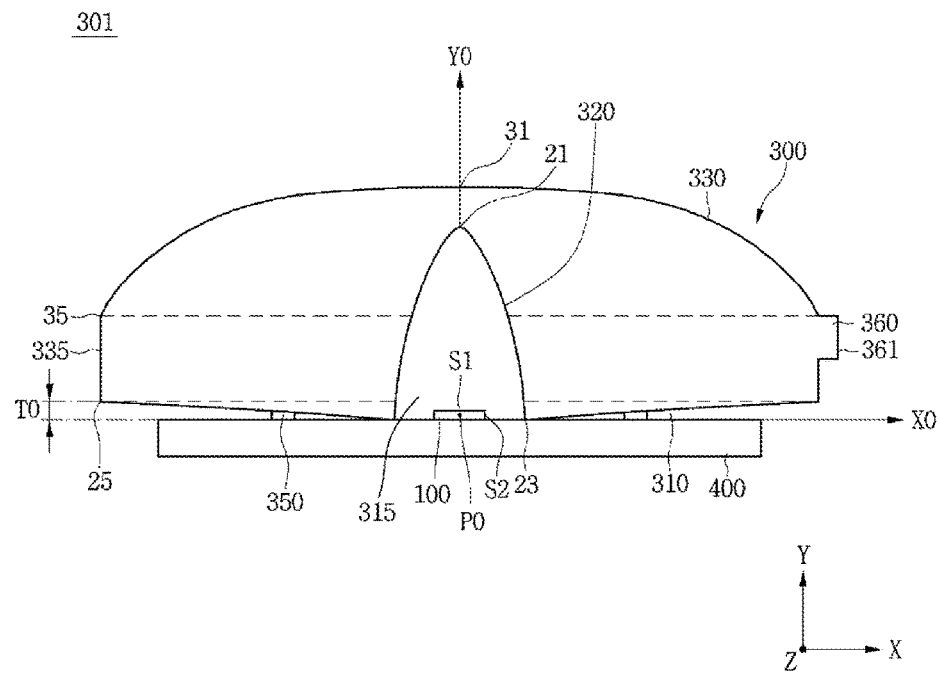

FIG. 15 is a view showing an example of the optical lens according to an embodiment, which is a sectional view taken along line A-A in the lighting module of FIG. 1.

Figure 16:
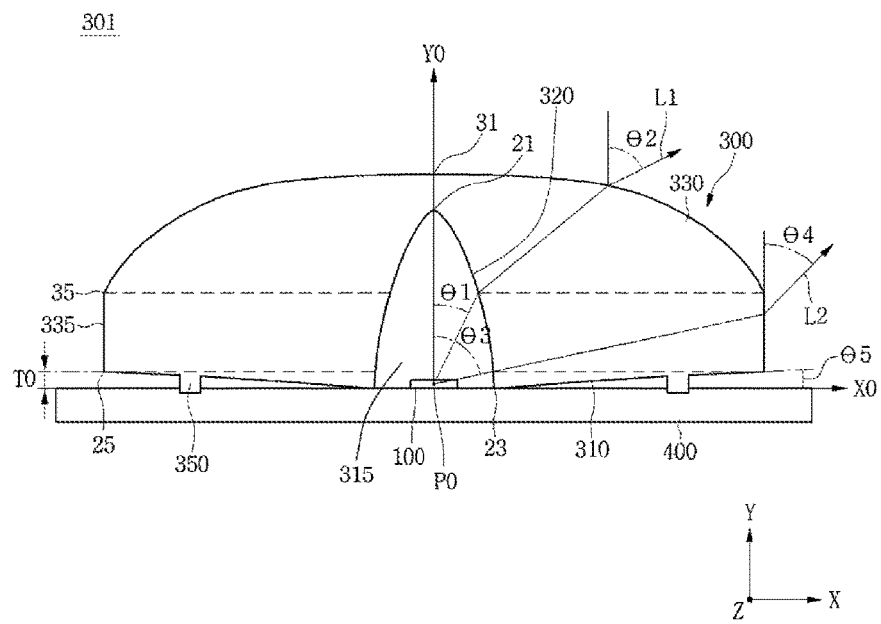

FIG. 16 is a view showing an example of the optical lens according to an embodiment, which is a sectional view taken along line B-B in the lighting module of FIG. 1.

Figure 17:
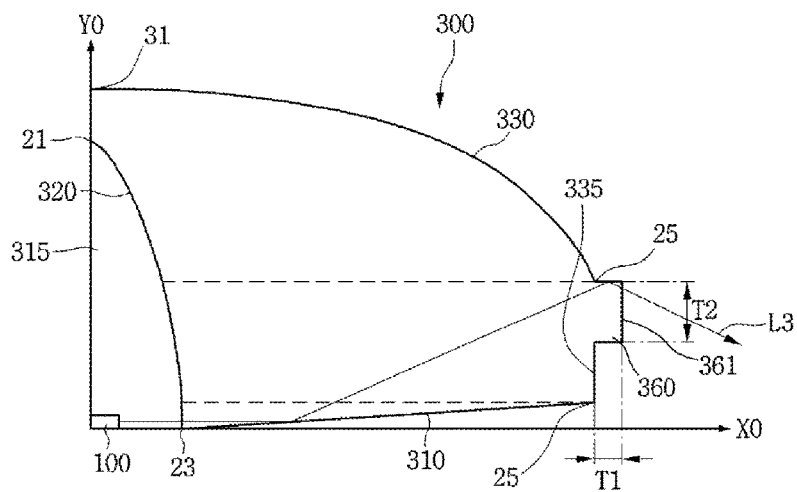

FIG. 17 is a detailed configuration view of the optical lens of the lighting module according to an embodiment.

Figure 18:
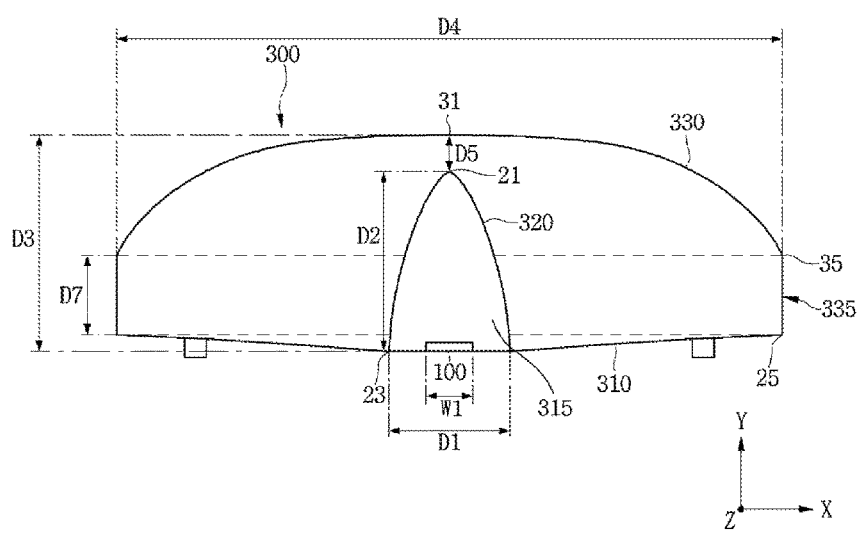

FIG. 18 is a view showing a side protruding part of the optical lens of FIG. 17.

Figure 19:
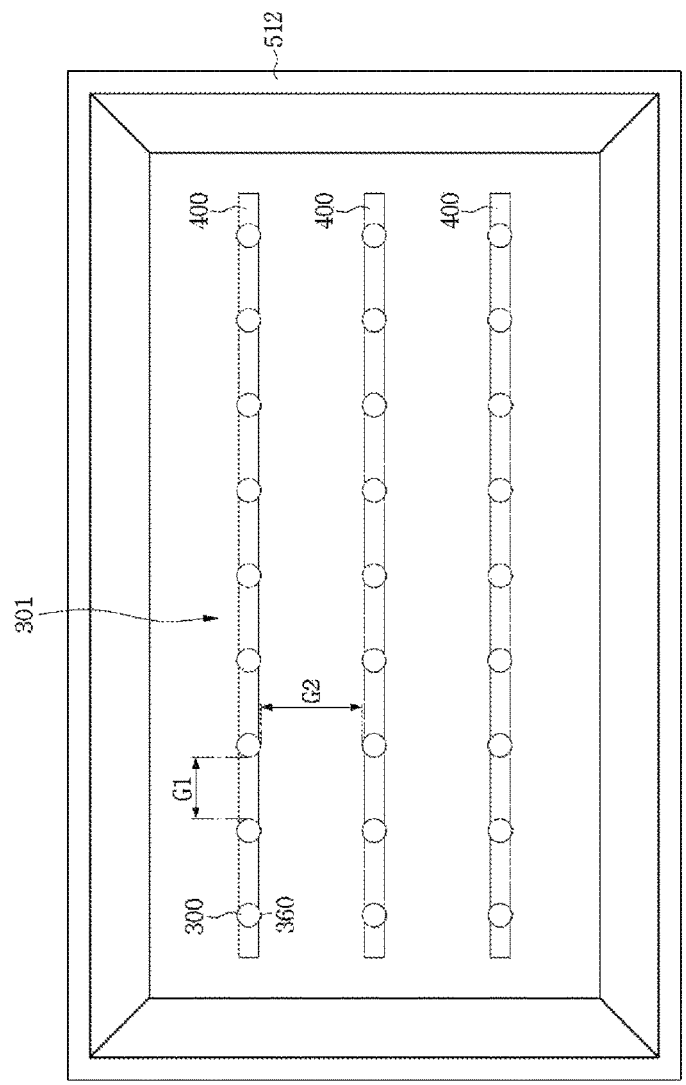

FIG. 19 is a view showing a light unit having a lighting module according to an embodiment.

Figure 20:
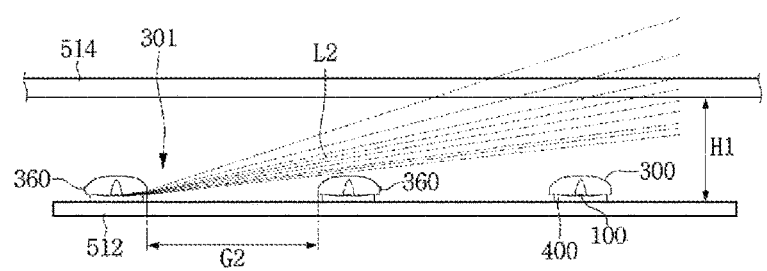

FIG. 20 is a view showing the light unit in which an optical sheet is disposed on the lighting module of FIG. 19.

Figure 21:
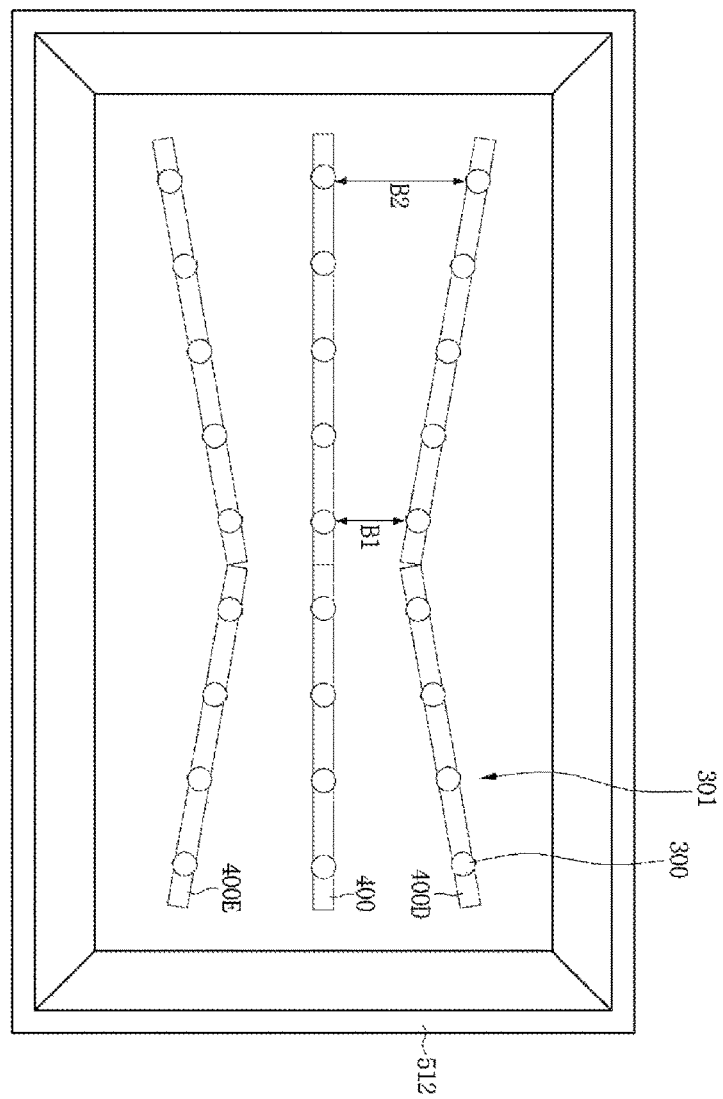

FIG. 21 is a view showing another example of the light unit having the lighting module according to an embodiment.

Figure 22:
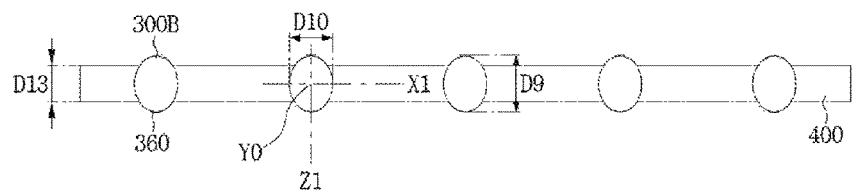

FIG. 22 is a view showing another example of an optical lens in the lighting module according to an embodiment.

Figure 23:
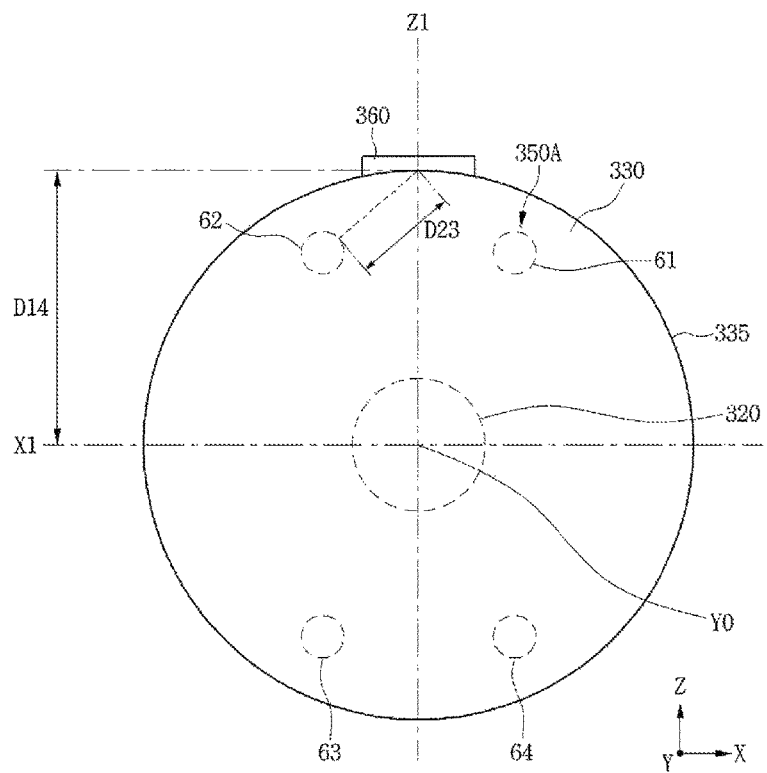

FIG. 23 is a view showing positions of support protrusions of an optical lens according to an embodiment.

Figure 24:
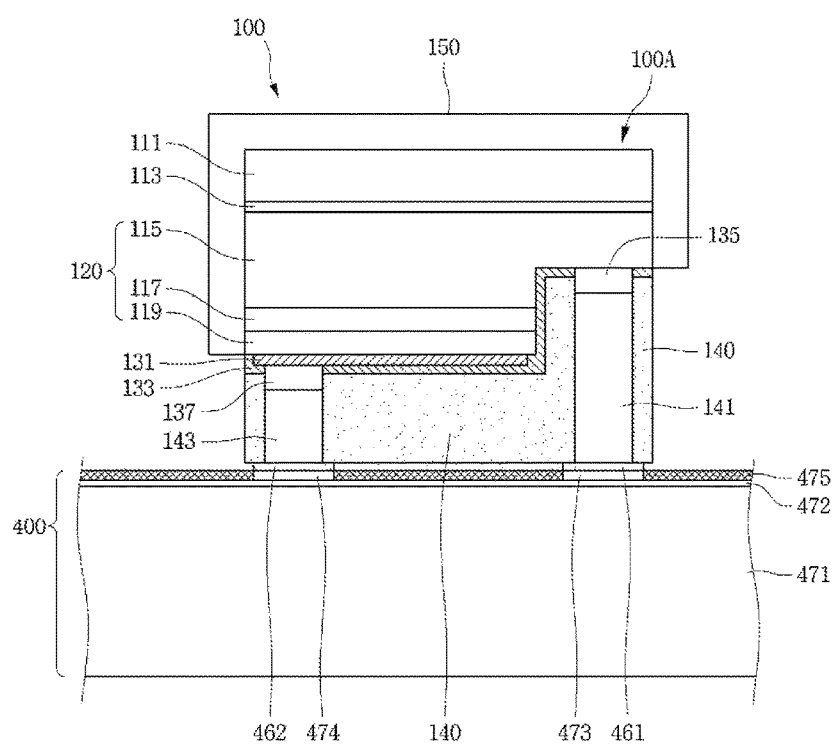

FIG. 24 is a first example showing a detailed configuration of a light emitting device disposed on a circuit board according to an embodiment.

Figure 25:
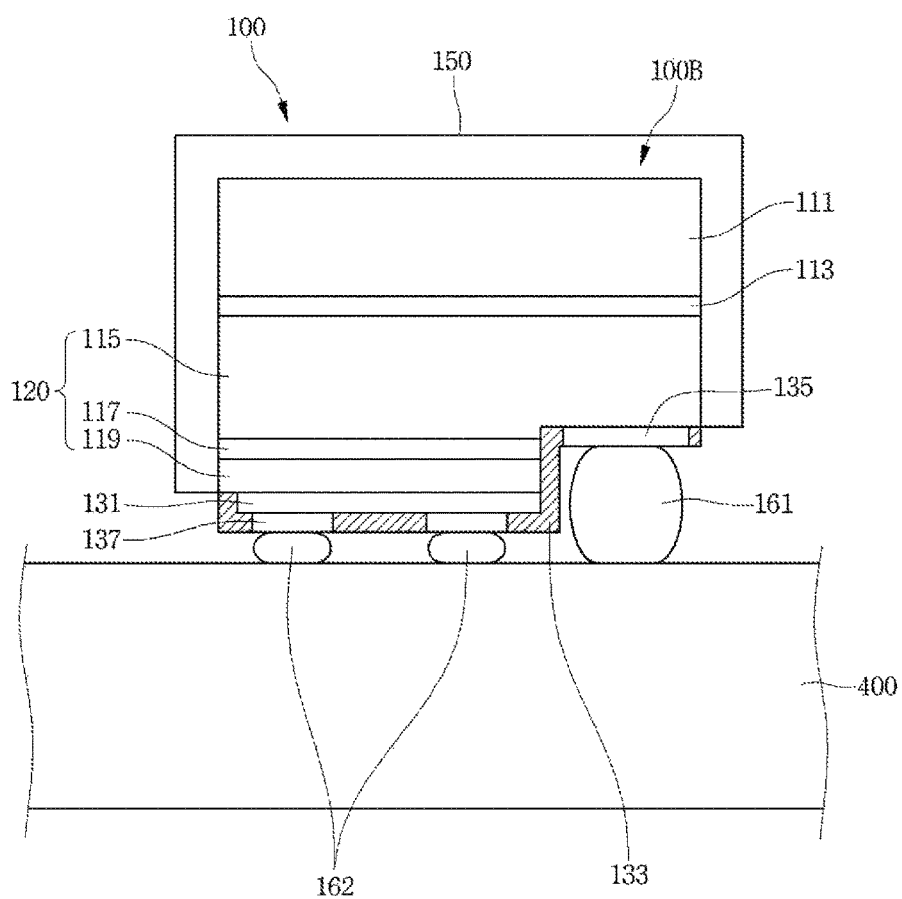

FIG. 25 is a second example of the light emitting device disposed on the circuit board according to an embodiment.

Figure 26:
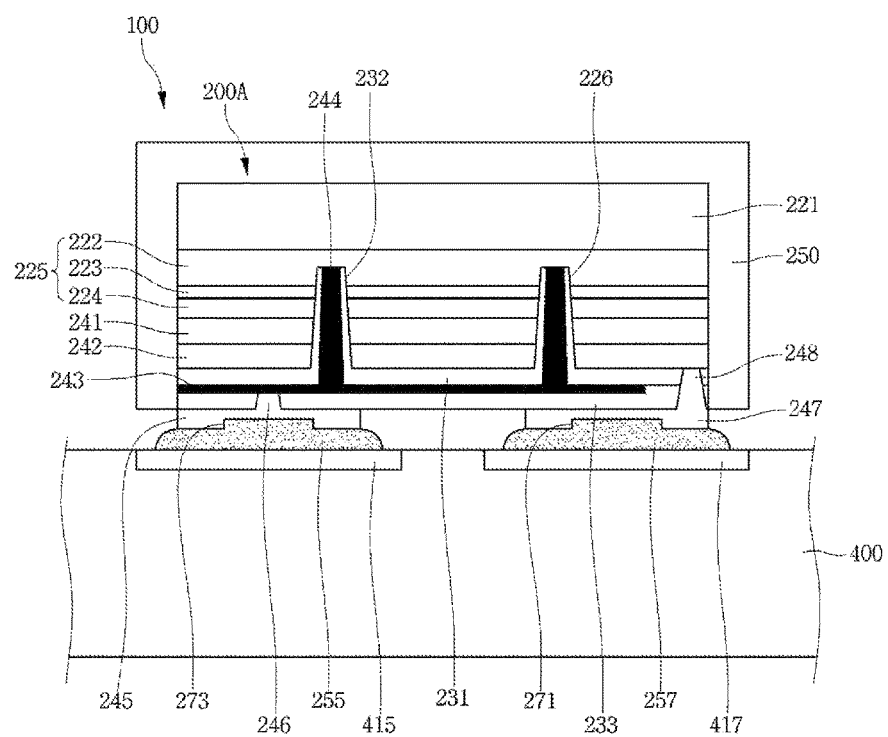

FIG. 26 is a view showing a third example of the light emitting device disposed on the circuit board according to an embodiment.

BEST MODE

Hereinafter, exemplary embodiments will be described in detail with reference to the accompanying drawings. In the description of the embodiments, it will be understood that, when a layer (film), a region, a pattern or a structure is referred to as being "on" or "under" another layer (film), another region, another pattern or another structure, it can be "directly" or "indirectly" on the other layer (film), region, pattern, or structure, or one or more intervening layers may also be present. Such a position of the layer has been described with reference to the drawings.

Hereinafter, optical lenses and lighting modules having the same according to embodiments will be described with reference to the accompanying drawings.

Figure 2:
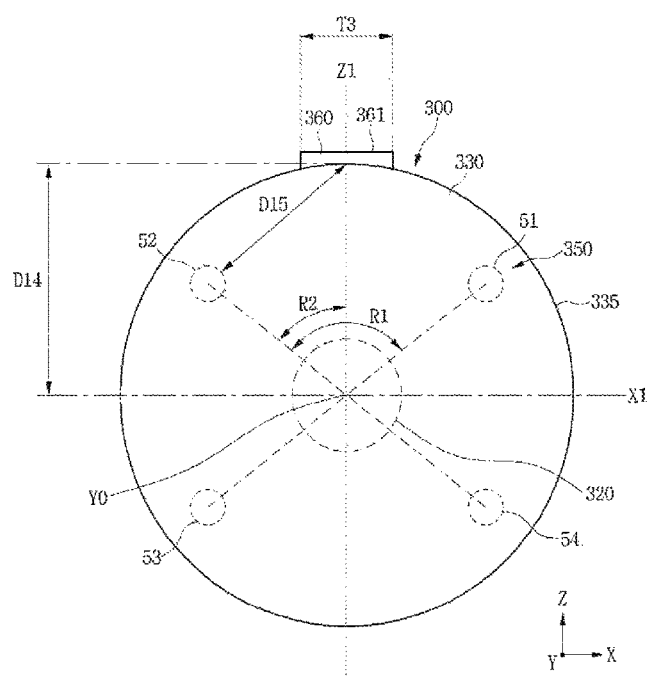
FIG. 2 is a plan view of an optical lens of FIG. 1.
Figure 3:
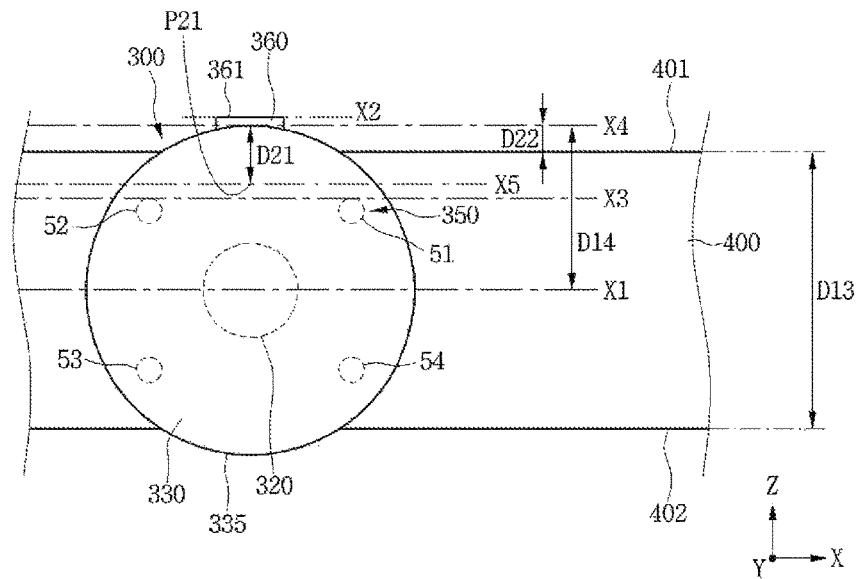
FIG. 3 is a plan view showing a circuit board and the optical lens in the lighting module of FIG. 1.
Figure 4:
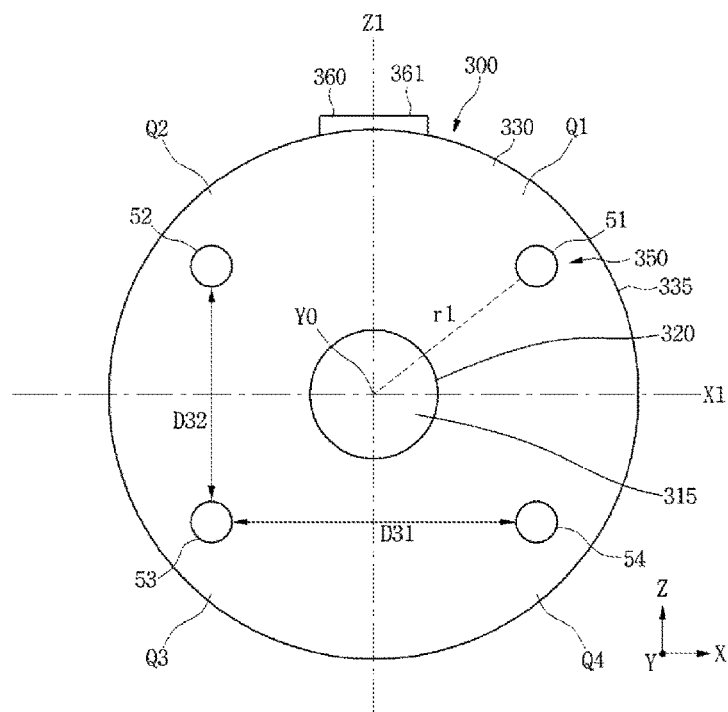
FIG. 4 is a bottom view of the optical lens of FIG. 1.

FIG. 1 is a plan view of a lighting module according to an embodiment. FIG. 2 is a plan view of an optical lens of FIG. 1. FIG. 3 is a plan view showing a circuit board and the optical lens in the lighting module of FIG. 1. FIG. 4 is a bottom view of the optical lens of FIG. 1.

Referring to FIGS. 1 to 4, the lighting module 301 includes a light emitting device 100, an optical lens 300 disposed over the light emitting device 100, and a circuit board 400 under the light emitting device 100.

The light emitting device 100 may be disposed on the circuit board 400 to be located between the optical lens 300 and the circuit board 400. The light emitting device 100 is driven by receiving power supplied from the circuit board 400 and emits light.

The light emitting device 100 may include a light emitting diode (LED) chip having a compound semiconductor, e.g., at least one of an ultraviolet (UV) LED chip, a blue LED chip, a green LED chip, a white LED chip, and a red LED chip. The light emitting device 100 may include at least one of Group II-VI compound semiconductors and Group III-V compound semiconductors or all thereof. The light emitting device 100 may emit at least one of red light, green light, blue light, UV light, and white light. The light emitting device 100 may be defined as a light source.

The optical lens 300 may change a path of light emitted from the light emitting device 100 and then extract the light to the outside.

The optical lens 300 may have different light output surfaces 330 and 335. The different light output surfaces 330 and 335 include, for example, a first optical light output surface 330 that is an upper surface of the optical lens 30 and a second light output surface 335 disposed at an outer circumference of the optical lens 300. The first light output surface 330 includes a spherical surface, and the second light output surface 335 includes a side section having an aspherical surface.

The optical lens 300 includes a recess 315 and an incident surface 320 at the circumference of the recess 315. The recess 315 is convexly recessed in an opposite direction of the circuit board 400 from a bottom surface 310 of the optical lens 300, and the incident surface 320 has a curved surface at the circumference of the recess 315. The recess 315 may have a hemispherical or hemi-elliptical shape, and its detailed description will be described later. A structure of the optical lens 300 will be described in detail later.

The optical lens 300 includes a plurality of support protrusions 350 arranged at the bottom thereof. The support protrusion 350 protrudes in a downward direction, i.e., the direction of the circuit board 400 from the bottom surface 310 of the optical lens 300. The plurality of support protrusions 350 are fixed on the circuit board 400, and can prevent the optical lens 300 from being tilted. Insertion grooves into which the respective support protrusions 350 are inserted may be arranged on the circuit board 400. If the support protrusion 350 is inserted into the insertion groove of the circuit board 400, the support protrusion 350 may be adhered using an adhesive member (not shown).

The circuit board 400 may be disposed in a light unit such as a display device, a terminal, or a lighting device. The circuit board 400 may include a circuit layer electrically connected to the light emitting device 100. The circuit board 400 may include at least one of a resin PCB, a metal core PCB (MCPCB), and a flexible PCB (FPCB), but the present disclosure is not limited thereto. A protective layer (not shown) is disposed on the circuit board 400. The protective layer may include a material that absorbs or reflects light reflected from the optical lens 300.

Referring to FIGS. 1 and 2, when viewed from the top, the circuit board 400 has a first length in a direction of a first axis X1, which is longer than a second length D13 in a direction of a second axis Z1. The first length is a horizontal length, and the second length D13 may be a vertical length or width.

The second length D13 of the circuit board 400 may be smaller than or equal to a diameter D4 or width of the optical lens 300. For example, the second length D13 may be formed smaller than the diameter D4 or width of the optical lens 300. Accordingly, the second length D13 of the circuit board 400 can be decreased, thereby saving cost.

The first length of the circuit board 400 may be formed to have a length two times greater than the diameter or width of the optical lens 300. For example, the first length of the circuit board 400 may have a length longer than the sum of diameters or widths of four or more optical lenses 300. Therefore, the first length of the circuit board 400 may be formed, for example, four times longer than the second length D13, but the present disclosure is not limited thereto.

The plurality of support protrusions 350 of the optical lens 300 may overlap with the circuit board 400 in a vertical direction. The optical lens 300 may include a transparent material. The optical lens 300 may include at least one of polycarbonate (PC), poly methacrylic acid methyl (PMMA), silicon or epoxy resin, or glass. The optical lens 300 may include a transparent material having a refractive index ranging from 1.4 to 1.7.

The optical lens 300 includes a side protruding part 360 protruding to the outermost side thereof. The side protruding part 360 protrudes outward from the second light output surface 335. A portion or whole of the side protruding part 360 may protrude outward of the region of the circuit board 400. The side protruding part 360 may be disposed in a region not overlapping with the circuit board 400 in the vertical direction. The side protruding part 360 may protrude outward of at least one of first and second sides 401 and 402 of the circuit board 400.

The side protruding part 360 is a part formed by cutting a region for a gate in injection molding, and may be defined as a gate part, a cutting part, a protrusion, or a mark part. However, the present disclosure is not limited thereto. One side protruding part 360 may be disposed in the optical lens 300. The optical lens 300 may further include at least one protrusion protruding outward in addition to the side protruding part 360, but the present disclosure is not limited thereto.

An outer surface 361 of the side protruding part 360 of the optical lens 300 may be formed as a rough surface. Here, the rough surface may have a surface roughness higher than that of the first light output surface 330. The rough surface may have a transmittance lower than that of the first light output surface 330. The rough surface may be a cutting surface.

The region of the side protruding part 360 may have an unequal light distribution due to the low transmittance and the high surface roughness. Further, it is difficult to control the emission angle of light. Light emitted through the region of the side protruding part 60 may be irradiated onto an adjacent optical lens. That is, when the region of the side protruding part 360 is disposed in the direction of the first axis X1 or disposed to overlap with the circuit board 400 in the vertical direction, light emitted through the side protruding part 360 is irradiated onto an adjacent optical lens 300, and therefore, light interference may occur. Alternatively, the light emitted through the side protruding part 360 is reflected by the circuit board 400, which may have influence on light uniformity.

In the embodiment, the side protruding part 360 of the optical lens 300 is perpendicular to a light axis Y0 and may be disposed in the direction of the second axis Z1 instead of a direction in which optical lenses 300 are arranged. The direction of the second axis Z1 may be disposed perpendicular to the direction of the first axis X1 on the same plane. The side protruding part 360 may protrude from the second light output surface 335. A plane horizontal to the outer surface 361 of the side protruding part 360 may be perpendicular to the direction of the second axis Z1. As shown in FIG. 3, the direction of a straight line X2 horizontal to the outer surface 361 of the side protruding part 360 may be parallel to the direction of the first axis X1. Here, when the first and second axes X1 and Z1 are disposed on the same horizontal plane, they may be perpendicular to each other while passing through the light axis Y0.

Referring to FIG. 2, the plurality of support protrusions 350 may include first and second support protrusions 51 and 52 adjacent to the side protruding part 360, and third and fourth support protrusions 53 and 54 further spaced apart from the incident surface 320 with respect to the side protruding part 360.

The support protrusions 51 to 54 may have the same bottom-view shape. As an example, the bottom-view shape of the support protrusions 51 to 54 may be circular, elliptical, or polygonal. As another example, the bottom-view shape of at least one of the support protrusions 51 to 54 may be different from that of the other support protrusions. For example, if the bottom-view shape of any one is circular or polygonal, the bottom-view shape of the others may be different from that of the one.

An arbitrary point of the side protruding part 360, e.g., a center point may be disposed to have a distance D15 from the first or second support protrusion 51 or 52, which is shorter than a distance D14 from the light axis Y0. As the distance D15>the distance D14, the first to fourth support protrusions 51 to 54 can stably support the optical lens 300 at the circumference of the incident surface 320. The distance D14 may be a radius when the optical lens 300 has a circular shape.

With respect to the light axis Y0, an angle R2 between the second axis Z1 passing through the center point of the side protruding part 360 and the second support protrusion 52 may be obtuse angle, and may exceed, for example, 45 degrees.

Here, among the plurality of support protrusions 350, an angle R1 between the first and second protrusions 51 and 52 adjacent to the side protruding part 360 with respect to the light axis Y0 may exceed 90 degrees. This means that the plurality of support protrusions 350 may be disposed more adjacent to the first axis X1 than the second axis Z1. As the plurality of support protrusions 350 are disposed more adjacent to the first axis X1, they can stably support the optical lens 300, and thus the length D13 of the circuit board 400 in the direction of the second axis Z1 can be decreased.

Referring to FIG. 3, the first and second support protrusions 51 and 52 may be further spaced apart from each other than a distance D21 from a horizontal straight line X5 passing through a point P21 that is ⅓ of the radius D14 of the optical lens 300.

The first or second side 401 or 402 of the circuit board 400 may be disposed outward of a horizontal straight line X3 passing through the plurality of support protrusions 350, and may be disposed inward of an outer circumference of the optical lens 300, e.g., a horizontal straight line X4 passing through the second light output surface 335. The first side 401 of the circuit board 400 may be spaced apart from the straight line X4 at a predetermined distance D22.

Referring to FIG. 4, the plurality of support protrusions 350 may be respectively disposed in first to fourth quadrants Q1, Q2, Q3, and Q4 divided from the second axis Z1 passing through the center of the side protruding part 360 with respect to the light axis Y0 of the optical lens 300 and the first axis X1 perpendicular to the second axis Z1. Also, the plurality of support protrusions 350 (51, 52, 53, and 54) may be disposed closer to the first axis X1 than the second axis Z1.

The plurality of support protrusions 350 may be spaced apart from the light axis Y0 at the same distance r1, but the present disclosure is not limited thereto. At least one of the plurality of support protrusions 350 may have a different distance from the light axis Y0, as compared with the others, but the present disclosure is not limited thereto.

For distances between the plurality of support protrusions 350 (51, 52, 53, and 54), a distance D31 between the support protrusions in the direction of the first axis X1 may be greater than that D32 between the support protrusions in the direction of the second axis Z1.

For the plurality of support protrusions 350 (51, 52, 53, and 54), at least four support protrusions may be arranged in a polygonal shape, e.g., a quadrangular shape, i.e., a rectangular shape. As another example, for the plurality of support protrusions 350 (51, 52, 53, and 54), four or more, e.g., five or six or more support protrusions may be disposed, but the present disclosure is not limited thereto.

In the embodiment, the plurality of support protrusions 350 (51, 52, 53, and 54) are spaced apart from each other not to overlap with the region of the side protruding part 360 and the second axis Z1, and are disposed closer to the direction of the first axis X1. Thus, it is possible to reduce that the plurality of support protrusions 350 (51, 52, 53, and 54) have influence on the second light output surface 335 in injection molding.

If one or more (61 and 62) among a plurality of support protrusions 350A (61, 62, 63, and 64) are disposed at a distance D23 adjacent to the side protruding part 360 in injection molding of an optical lens 300A as shown in a comparative example of FIG. 23, the region of the second light output surface 335, which is placed over the adjacent support protrusions 61 and 62, is influenced by the adjacent support protrusions 61 and 62 when a liquid lens material is injected. This may have influence on the light uniformity of the optical lens 300A, and may cause a defect of the optical lens 300A. The support protrusions 61 and 62 may be disposed closer to the second axis Z1 than the first axis X1. Also, the support protrusions 61 and 62 may be disposed more adjacent to the side protruding part 360 than the light axis Y0.

Figure 5:
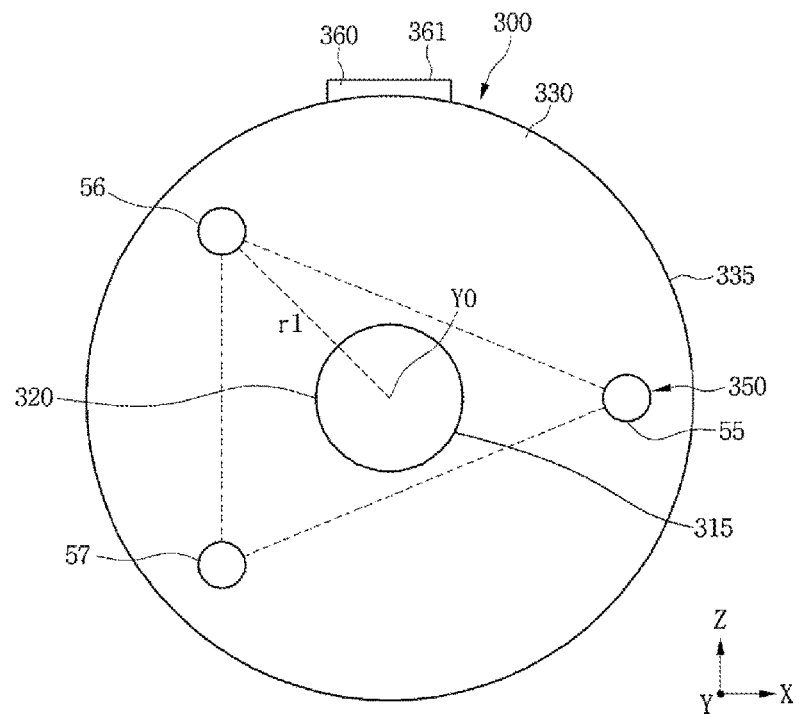
FIG. 5 is a view showing an example of support protrusions of the optical lens of FIG. 1.
Figure 6:
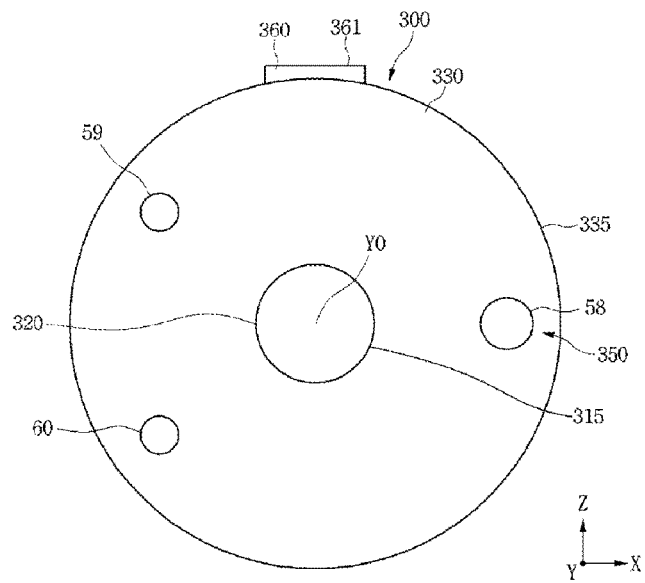
FIG. 6 is a view showing another example of the support protrusions of the optical lens of FIG. 1.

FIGS. 5 and 6 are views showing other examples of the support protrusions of the optical lens of FIG. 1.

Referring to FIG. 5, three support protrusions 350 (55, 56, and 57) of the optical lens 300 may be arranged in a triangular shape. The support protrusions 350 may have the same distance r1 from the light axis Y0, or any one of the support protrusions 350 may have a different distance from the light axis Y0 as compared with the others. However, the present disclosure is not limited thereto.

Referring to FIG. 6, at least one of a plurality of support protrusions 350 (58, 59, and 60) of the optical lens 300, e.g., any one support protrusion 58 may have a larger width or area than the other support protrusions 59 and 60. This means that the support protrusion 58 having a relatively distant distance among the plurality of support protrusions 350 may be smaller than the support protrusions 59 and 60 having a relatively close distance. Also, this means that the distance from the light axis Y0 may be in proportion to the bottom area of each of the support protrusions 58, 59, and 60.

Figure 7:
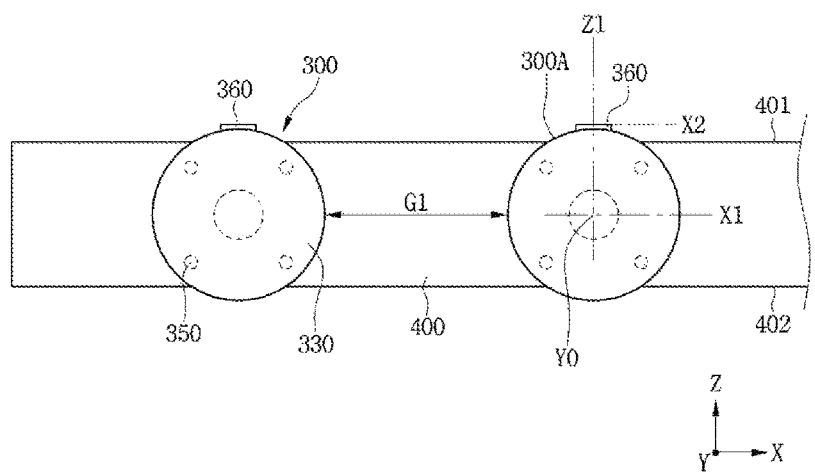
FIGS. 7 to 9 are views showing arrangement examples of optical lenses in a lighting module according to an embodiment.
Figure 8:
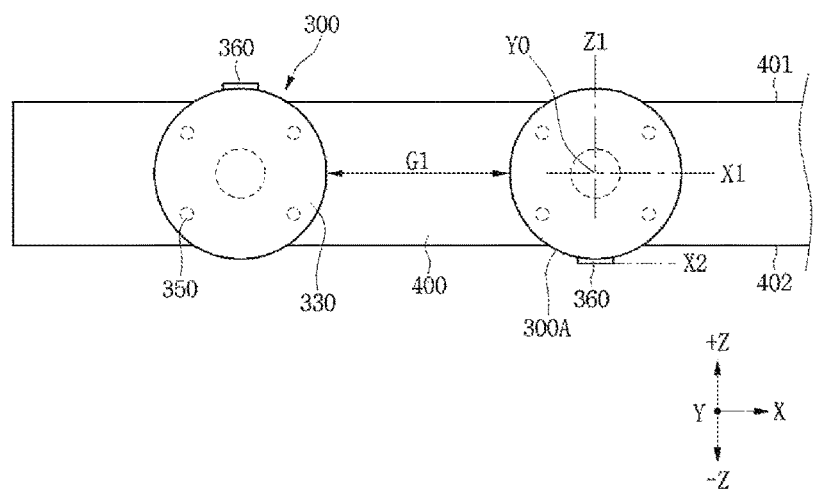
Figure 9:
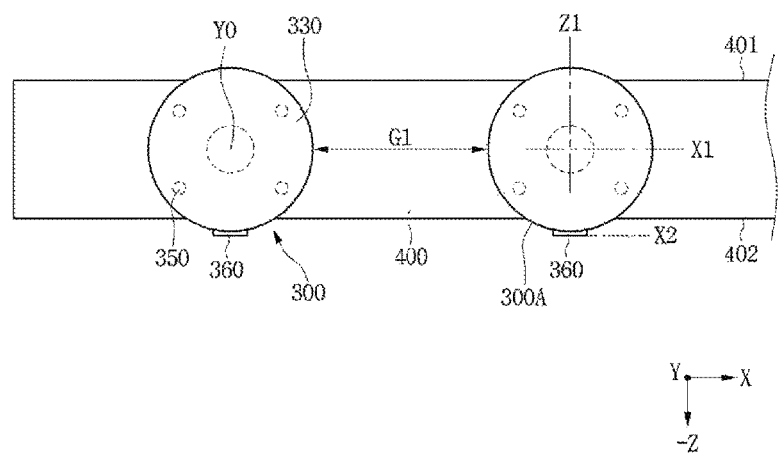

FIGS. 7 to 9 are views showing arrangement examples of optical lenses in a lighting module according to an embodiment.

Referring to FIG. 7, a plurality of optical lenses 300 and 300A may be arranged on a circuit board 400. The plurality of optical lenses 300 and 300A are arranged in the direction of a first axis X1, and may be spaced apart from each other at a predetermined distance G1.

A side protruding part 360 of each of the optical lenses 300 and 300A may protrude in the direction of a second axis Z1. For example, the side protruding part 360 of each of the optical lenses 300 and 300A may protrude in the direction of a first side 401 of the circuit board 400. A portion or whole of the side protruding part 360 of each of the optical lenses 300 and 300A may protrude outward of the first side 401 of the circuit board 400. The side protruding parts 360 of the plurality of optical lenses 300 and 300A may protrude outward of the first side 401 of the circuit board 400. The side protruding parts 360 of the plurality of optical lenses 300 and 300A may protrude in the same direction.

Referring to FIG. 8, the side protruding parts 360 of the plurality of optical lenses 300 and 300A may protrude in the opposite directions (+Z and −Z) with respect to the direction of the first axis X1 or with respect to a light axis Y0. The side protruding parts 360 of the plurality of optical lenses 300 and 300A may protrude in the first side 401 and a second side 402 of the circuit board 400, respectively. The side protruding parts 360 of the plurality of optical lenses 300 and 300A may protrude outward of the first and second sides 401 and 402 of the circuit board 400, respectively.

Referring to FIG. 9, the side protruding parts 360 of the plurality of optical lenses 300 and 300A may protrude in the same direction with respect to the first axis X1 or the light axis Y0. For example, the side protruding parts 360 of the plurality of optical lenses 300 and 300A may protrude in the direction of the second side 402 of the circuit board 400. A portion or whole of the side protruding part 360 of each of the plurality of optical lenses 300 and 300A may protrude outward from the second side 402 of the circuit board 400.

Figure 10:
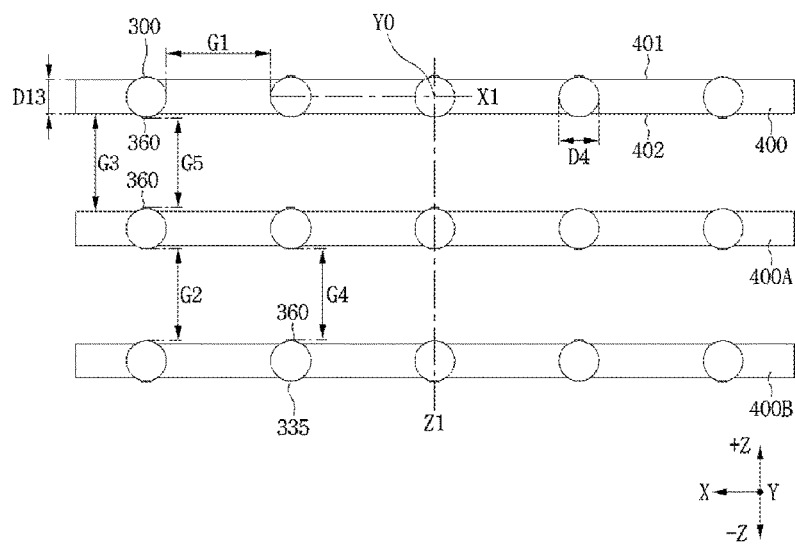
FIG. 10 is a view showing an example in which optical lenses are arranged on a plurality of circuit boards in a lighting module according to an embodiment.

FIG. 10 is a view showing an example in which optical lenses are arranged on a plurality of circuit boards in a lighting module according to an embodiment.

Referring to FIG. 10, a plurality of circuit boards 400, 400A, and 400B are arranged at a third distance G3 in the direction of a second axis Z1, and a plurality of optical lenses 300 are arranged along the direction of a first axis X1 on each of the circuit boards 400, 400A, and 400B. The plurality of circuit boards 400, 400A, and 400B may be defined as first to third circuit boards, respectively.

A side protruding part 360 of the optical lens 300 protrudes in the direction of the second axis Z1 perpendicular to the first axis X1 on each of the circuit boards 400, 400A, and 400B, and may protrude outward of a first or second side 401 or 402 of each of the circuit boards 400, 400A, and 400B. The side protruding part 360 of the optical lens 300 is disposed in the direction Z1 perpendicular to the direction X1 in which the optical lenses 300 are arranged on each of the circuit boards 400, 400A, and 400B, so that it is possible to reduce interference between adjacent optical lenses 300 on each of the circuit boards 400, 400A, and 400B. In addition, the side protruding part 360 is disposed outward of any one side 401 or 402 of each of the circuit boards 400, 400A, and 400B, so that it is possible to decrease a length D13, i.e., a width of each of the circuit boards 400, 400A, and 400B in the direction of the second axis Z1. Further, it is possible to reduce interference between the optical lenses 300 arranged on the first to third circuit boards 400, 400A, and 400B.

The side protruding part 360 may protrude in any one of positive and reverse directions (+Z and −Z) of the second axis Z1 with respect to a light axis Y0 of the optical lens 300.

Here, the distance between the optical lenses 300 of each of the circuit boards 400, 400A, and 400B is a first distance G1, and the distance between the optical lenses 300 disposed on the different circuit boards 400, 400A, and 400B is a second distance G2. Then, the second distance G2 is greater than the first distance G1. Here, the second distance G2 is a minimum distance between the optical lenses 300 disposed on the different circuit boards 400, 400A, and 400B. The first distance G1 may have the same distance or different distances on each of the circuit boards 400, 400A, and 400B. Alternatively, a group of the optical lenses 300 having the same distance may be disposed at a different distance with another region according to a region (center or side) in which the optical lens 300 is disposed. The second distance G2 may be smaller than a distance between the adjacent circuit boards 400, 400A, and 400B.

When a side protruding part 360 of one optical lens 300 and a second light output surface 335 of another optical lens 300 face each other on the different circuit boards 400, 400A, and 400B, the minimum distance between the side protruding part 360 and the second light output surface 335 may be a fourth distance G4. The fourth distance G4 may be smaller than the second distance G2.

When a side protruding part 360 of one optical lens 300 and a side protruding part 360 of another optical lens face each other on the different circuit boards 400, 400A, and 400B, the distance between the side protruding parts 360 in the direction of the second axis Z1 may be a fifth distance G5. The fifth distance G5 may be smaller than each of the second and fourth distances G2 and G4.

As another example, the optical lens 300 on the second circuit board 400A may be disposed to be shifted from the optical lenses 300 on the first and third circuit boards 400 and 400B in the direction of the second axis Z1. For example, the optical lens 300 on the second circuit board 400A may be disposed to be shifted by ½ of the first distance G1 with respect to the first axis Z1. That is, the optical lens 300 on the second circuit board 400A may be disposed in a middle region between the optical lenses 300 on the first to third circuit boards 400 and 400B.

As still another example, a plurality of optical lenses 300 may be arranged in the directions of the first and second axes while maintaining the distances G1 and G2 on one of the circuit boards 400, 400A, and 400B, but the present disclosure is not limited thereto.

(A) to (F) of FIG. 11 are views showing cases where optical lenses are arranged on each circuit board in a lighting module according to an embodiment.

Referring to (A) to (F) of FIG. 11, there are shown ratios of side protruding parts 360 protruding in the direction of a first side 401 of a second axis Z1 and side protruding parts 360 protruding in the direction of a second side of the second axis Z1 when a plurality of optical lenses 300 are arranged on one circuit board 400. Here, for convenience of illustration, when a side protruding part 360 protrudes in the direction of the first side 401 of the circuit board 400, the side protruding part 360 may be defined as a first side protruding part. When a side protruding part 360 protrudes in the direction of the second side 402 of the circuit board 400, the side protruding part 360 may be defined as a second side protruding part.

In (A) of FIG. 11, a ratio of first side protruding parts 360 protruding in the direction of the first side 401 of the circuit board 400 and second side protruding parts 360 protruding in the direction of the second side 402 of the circuit board 400 with respect to a light axis Y0 is 2:3, and the difference of the ratio may be about 20%. The direction of the first side 401 may be a positive direction +Z, and the direction of the second side 402 may be a reverse direction −Z.

In (B) of FIG. 11, a ratio of first side protruding parts 360 protruding in the direction of the first side 401 of the circuit board 400 and second side protruding parts 360 protruding in the direction of the second side 402 of the circuit board 400 with respect to the light axis Y0 is 3:2, and the difference of the ratio may be about 20%.

In (C) of FIG. 11, a ratio of first side protruding parts 360 protruding in the direction of the first side 401 of the circuit board 400 and second side protruding parts 360 protruding in the direction of the second side 402 of the circuit board 400 with respect to the light axis Y0 is 3:2, and the difference of the ratio may be about 20%.

In (D) of FIG. 11, a ratio of first side protruding parts 360 protruding in the direction of the first side 401 of the circuit board 400 and second side protruding parts 360 protruding in the direction of the second side 402 of the circuit board 400 with respect to the light axis Y0 is 4:1, and the difference of the ratio may be about 60%.

In (E) of FIG. 11, a ratio of first side protruding parts 360 protruding in the direction of the first side 401 of the circuit board 400 and second side protruding parts 360 protruding in the direction of the second side 402 of the circuit board 400 with respect to the light axis Y0 is 3:2, and the difference of the ratio may be about 20%.

In (F) of FIG. 11, a ratio of first side protruding parts 360 protruding in the direction of the first side 401 of the circuit board 400 and second side protruding parts 360 protruding in the direction of the second side 402 of the circuit board 400 with respect to the light axis Y0 is 5:0, and the difference of the ratio may be about 100%.

As shown in (A) to (F) of FIG. 11, a ratio of first side protruding parts 360 protruding in the positive direction +Z of the second axis Z1 and second side protruding parts 360 protruding in the reverse direction −Z of the second axis Z1 may be in a range of 0% to 100%. The difference of the ratio may range from 0% to 100%. In addition, the first or second side protruding parts 360 of adjacent optical lenses 300 may protrude in the same direction or protrude in the opposite directions with respect to the light axis Y0.

The side protruding parts 360 of the optical lens 300 disposed on one or different circuit boards may be disposed in the same direction or in different directions. The side protruding parts 360 disposed in the different directions may be opposite to each other. In the embodiment, the side protruding parts 360 of the optical lens 300 disposed on one or the other circuit boards are provided with lens groups protruded in the same direction from each other, and lens groups protruding in opposite directions are mixed.

FIG. 12 is a bottom view showing another example of the optical lens according to an embodiment. FIG. 13 is a plan view showing a lighting module having the optical lens of FIG. 12.

Referring to FIG. 12, any one of a plurality of support protrusions 350 (51A, 52, 53, and 54) of an optical lens 300 or 300A may have a different bottom-view shape from the other support protrusions. For example, a first support protrusion 51A adjacent to a side protruding part 360 among the plurality of support protrusions 51A, 52, 53, and 54 may have a different shape from the other support protrusions, i.e., second to fourth support protrusions 52 to 54. For example, the bottom-view shape of the first support protrusion 51A may be a polygonal shape, and the bottom-view shape of the second to fourth support protrusions 52 to 54 may be a circular shape. On the contrary, the bottom-view shape of the first support protrusion 51A may be a circular shape, and the bottom-view shape of the second to fourth support protrusions 52 to 54 may be a polygonal shape.

The first support protrusion 51A is disposed adjacent to the side protruding part 360, and therefore, the protruding direction of the side protruding part 360, e.g., a positive or reverse direction of a second axis Z1 may be determined according to the fixing position of the first support protrusion 51A.

According to positions of the first support protrusion 51A and the side protruding part 360, as shown in FIG. 13, the protruding directions of side protruding parts 360 of a plurality of optical lenses 300 and 300A mounted on each circuit board 400 may be arranged in the same direction. Here, it is difficult to identify the positions of the side protruding parts 360 when the optical lenses 300 and 300A are fixed on the circuit board 400, and hence the direction of the side protruding part 360 may be recognized using the first support protrusion 51A.

When a plurality of circuit boards 400 are arranged, the side protruding parts 360 of the plurality of optical lenses 300 and 300A arranged on the outermost circuit board 400 may be arranged to protrude in the opposite directions to each other. In this case, the direction of the side protruding part 360 may be determined based on the position of the first support protrusion 51A. For example, the side protruding parts 360 of the plurality of optical lenses 300 and 300A arranged on the uppermost circuit board 400 may be arranged to protrude to in the direction of a first side 401 of the circuit board 400 or a positive direction +Z of the second axis Z1, and the side protruding parts 360 of the plurality of optical lenses 300 and 300A arranged on the lowermost circuit board 400 may be arranged to protrude in the direction of a second side 402 of the circuit board 400 or a reverse direction −Z of the second axis Z1.

When the side protruding parts 360 of the optical lenses 300 and 300A arranged on the outermost circuit board 400 are arranged to protrude in an inner direction, adjacent optical lenses may be influenced by light interference. In an embodiment, the side protruding parts 360 of the optical lenses 300 and 300A arranged on the outermost circuit board 400 may be arranged to protrude, for example, in an outer direction. In the optical lenses 300 and 300A, the protruding direction of the side protruding part 360 can be adjusted using the first support protrusion 51A as an identification mark.

In the embodiment, the protruding direction of the side protruding part 360 can be adjusted in a direction in which light interference can be reduced, using the difference in shape between the plurality of support protrusions 51A, 52, 53, and 54.

FIG. 14 is a side view showing an example of the optical lens 300 according to an embodiment. FIG. 15 is a sectional view taken along line A-A in the lighting module of FIG. 1. FIG. 16 is a sectional view taken along line B-B in the lighting module of FIG. 1. FIG. 17 is a partially enlarged view of the optical lens 300 of FIG. 15.

An optical lens 300 will be described in detail with reference to FIGS. 14 to 17.

Referring to FIGS. 14 to 17, the optical lens 300 includes a bottom surface 310, a recess 315 recessed upward of the bottom surface 310, an incident surface 320 at the circumference of the recess 315, a first light output surface 330 disposed at the opposite side to the bottom surface 310 and the incident surface 320, a second light output surface 335 disposed at a lower circumference of the first light output surface 330, and a side protruding part 360 described above.

The recess 315 has a shape recessed in the direction of a light axis Y0 from a center region of the bottom surface 310. The recess 315 may have a deeper depth as it comes closer to the center region or the light axis Y0.

A direction perpendicular to the top of a light emitting device 100 may be referred to as the direction of the light axis Y0. The direction of the light axis Y0 may be a direction perpendicular to a top surface of a circuit board 400. The direction of a first axis X1 perpendicular to the light axis Y0 may be a direction perpendicular to the light axis Y0 from the light emitting device 100.

The width D1 of the recess 315 may become gradually narrower toward the apexes 21 and 31. The recess 315 may be closer to the first light exit surface 330 as it goes up.

The side sectional shape of the recess 315 may include a hemispherical or hemi-elliptical shape, and the lower surface shape of the recess 315 may include a circular or polygonal shape. The incident surface 320 is disposed at the circumference of the recess 315 recessed upward from the center region of the bottom surface 310. The incident surface 320 may include a curved surface.

The incident surface 320 may be formed as a rotating body having a Bezier curve. The curve of the incident surface 320 may be implemented as a spline curve, example, a cubic curve, a B-spline curve, or a T-spline curve. The curve of the incident surface 320 may be implemented as a Bezier curve.

The incident surface 320 is a surface of the recess 315, and may be disposed outside top and side surfaces S1 and S2 of the light emitting device 100.

The bottom surface of the optical lens 300 may include a flat surface, a curved surface, or curved and flat surfaces. The bottom surface 310 may be provided as a surface inclined or curved with respect to the top surface of the circuit board 400. The bottom surface 310 of the optical lens 300 may be provided as a surface inclined or curved with respect to a straight line horizontal to the top surface of the circuit board 400. The bottom surface 310 may be provided such that 80% or more of the bottom surface 310 is inclined or curved with respect to the top surface of the circuit board 400. The bottom surface 310 may include a total reflection surface.

The bottom surface of the optical lens 300 includes a first edge 23 and a second edge 25. The first edge 23 is a boundary place between the incident surface 320 and the bottom surface 310, and may become a bottom place of the optical lens 300. The first edge 23 may be located lower than the second edge 25 with respect to a horizontal line. The first edge 23 may become a lower circumference of the incident surface 320.

The second edge 25 may be disposed at a lower circumference of the second light output surface 335 or the outermost circumference of the bottom surface 310. The second edge 25 may be a boundary place between the bottom surface 310 and the second light output surface 335.

The first edge 23 and the second edge 25 may be both ends of the bottom surface 310. The bottom-view shape of the first edge 23 may be a circular or elliptical shape, and the bottom-view shape of the second edge 25 may be a circular or elliptical shape.

The optical lens 300 receives light emitted from the light emitting device 100 through the incident surface 320 and emits the received light through the first and second light output surfaces 330 and 335. A portion of light incident from the incident surface 320 may be irradiated onto the bottom surface 310 via a predetermined path.

If light emitted from the light emitting device 100 is incident onto the incident surface 320 with a predetermined directional angular distribution, the optical lens 300 may diffuse the incident light through the first and second light output surfaces 330 and 335.

The incident surface 320 of the optical lens 300 may be disposed to face the top surface S1 and the plurality of side surfaces S2. Light emitted from the side surface S2 may be irradiated onto the incident surfaces 320. Accordingly, the light emitted from the side surface S2 of the light emitting devices 100 can be incident onto the incident surface 320 without any light loss.

The light emitting device 100 emits light through the top surface S1 and the plurality of side surfaces S2. For example, the light emitting device 100 has five or more light output surfaces. The plurality of side surfaces S2 of the light emitting device 100 have a structure including at least four side surfaces, and may be light output surfaces.

The light emitting device 100 provides five or more light output surfaces, and thus the directional angular distribution of light can be widened by the light emitted through the side surfaces S2. The directional angular distribution of light of the light emitting device 100 may be 140 degrees or more, e.g., 142 degrees or more. The half width of the directional angular distribution of the light emitting device 100 may be 70 degrees or more, e.g., 71 degrees or more. The half width refers to a width having ½ of the maximum intensity of light in the directional angular distribution. The directional angular distribution of light of the light emitting device 100 is widely provided, so that light can be more easily diffused using the optical lens 300.

The top surface of the circuit board 400 may be disposed more adjacent to the first edge 23 than the second edge 25 of the bottom surface 310 of the optical lens 300. The first edge 23 of the bottom surface 310 may be contacted with the top surface of the circuit board 400, and the second edge 25 of the bottom surface 310 may be spaced apart from the top surface of the circuit board 400 at a maximum distance T0. The second edge 25 may be disposed at a lower position than an active layer in the light emitting device 100, thereby preventing loss of light.

The first and second light output surfaces 330 and 335 of the optical lens 300 refracts incident light and emits the refracted light. The second light output surface 335 refracts light such that, with respect to the light axis Y0, the angle of light emitted through the second light output surface 335 after the refraction is smaller than that of light incident before the refraction. Accordingly, it is possible to provide a long light interference distance between adjacent optical lenses 300. Further, a portion of light emitted through the second light output surface 335 and light emitted through the first light output surface 330 can be mixed with each other around the optical lens 300.

The first light output surface 330 of the optical lens 300 may be formed as a spherical surface from which light is emitted through the entire region thereof. The center region of the first light output surface 330 may be a apex 31 or high point, and includes a curved shape continuously connected from the apex 31. The first light output surface 330 may reflect or refract incident light and emit the reflected or refracted light to the outside. The first light output surface 330 may refract light such that, with respect to the light axis Y0, the angle of light emitted through the first light output surface 330 after the refraction is greater than that of light incident before the refraction.

The first light output surface 330 of the optical lens 300 has a gradient increasing according to a distance from the light axis Y0 within a half angle of the directional angular distribution of light. The second light output surface 335 of the optical lens 300 includes a region out of the half angle of the directional angular distribution of light, and has a gradient increasing according to a distance from the light axis Y0.

The first light output surface 330 may be formed as a rotating body having a Bezier curve. The curve of the first light output surface 330 may be implemented as a spline curve, example, a cubic curve, a B-spline curve, or a T-spline curve. The curve of the first light output surface 330 may be implemented as a Bezier curve. Except the side protruding part 360, the optical lens 300 may be provided in a rotation symmetric shape with respect to the light axis Y0.

The center region of the first light output surface 330 is a region adjacent to the light axis Y0, and may be an upwardly convex curved surface or a flat surface. The region between the center region of the first light output surface 330 and the second light output surface 335 may be formed in the shape of a convex curved surface.

The incident surface 320 and the first light output surface 330 may have a positive curvature radius. The center region of the first light output surface 330 and its circumferential region do not have a negative curvature radius but may have positive curvature radii different from each other. The center region of the first light output surface 330 may include a region of which curvature radius is 0.

The curvature radius of the incident surface 320 may be smaller than that of the first light output surface 330. Alternatively, the inclination of the incident surface 320 may be greater than that of the first light output surface 330.

The second light output surface 335 is disposed at a lower circumference of the first light output surface 330 to refract incident light and emit the refracted light. The second light output surface 335 includes an aspherical shape or a flat surface. The second light output surface 335 may be, for example, a surface perpendicular to or inclined with respect to the top surface of the circuit board 400. When the second light output surface 335 may be formed as an inclined surface, separation is easily made in injection molding.

The second light output surface 335 may be disposed at an outer circumference of the optical lens 300. The second light output surface 335 may extend as a flat or aspherical surface from the lower circumference of the first light output surface 330 to the bottom surface 310. The second light output surface 335 may include a third edge 35 adjacent to the first light output surface 330. The second edge 25 may be a lower edge of the second light output surface 335, and the third edge 35 may be an upper edge of the second light output surface 335 or a boundary place between the first and second light output surfaces 330 and 335. The side protruding part 360 protrudes from a portion of the second light output surface 335, and may be disposed more adjacent to the first light output surface 330 than the bottom surface 310. A top surface of the side protruding part 360 may protrude outward from the third edge 35 of the second light output surface 335.

The second light output surface 335 receives a portion of incident light emitted through the side surfaces S2 of the light emitting device 100 to refract the incident light and emit the refracted light. In this case, with respect to the light axis Y0, the angle of light emitted through the second light output surface 335 after the refraction may be smaller than that of light incident before the refraction. Accordingly, it is possible to provide a long light interference distance between adjacent optical lenses 300.

Referring to FIG. 18, the optical lens 300 may be formed such that its width or diameter D4 is wider than its thickness D3. The width or diameter D4 may be 2.5 times or more, e.g., three times or more of the thickness D3. The width or diameter D4 of the optical lens 300 may be 15 mm or more. Since the width or diameter D4 of the optical lens 300 is wider than the thickness D3 in the above-described range, a uniform brightness distribution can be provided to the entire region of a light unit, e.g., a backlight unit. Further, it is possible to decrease the thickness of the light unit.

Here, the bottom width D1 of the incident surface 320 of the optical lens 300 may be that of the recess 315. The recess 315 may be formed such that its bottom width is wider than the width W1 of the light emitting device 100. The incident surface 320 and the recess 315 have sizes in which light emitted from the light emitting device 100 can be easily incident therethrough.

The depth D2 of the recess 315 may be formed equal to or deeper than the bottom width D1 of the incident surface 320. The depth D2 of the recess 315 may be a depth that is 75% or more, e.g., 80% or more of the thickness D3 of the optical lens 300. The depth D2 of the recess 315 may be 80% or more of the distance between the apex 31 of the first light output surface 330 and the bottom surface 310 or the first edge 23. As the depth D2 of the recess 315 is deeply formed, light can be laterally diffused even in an adjacent region of the apex 21 of the incident surface 320 even though the center region of the first light output surface 330 does not have a total reflection surface or a negative curvature. The depth D2 of the recess 315 is a depth of the apex 21 of the incident surface 320. As the depth of the apex 21 of the incident surface 320 is deeply formed, incident light incident through the apex 21 and its circumferential region can be laterally diffused.

The ratio (D1:W1) of the bottom width D1 of the incident surface 320 and the width W1 of the light emitting device 100 may range from 1.8:1 to 3.0:1. When the bottom width D1 of the incident surface 320 is formed at least three times smaller than the width W1 of the light emitting device 100, light emitted from the light emitting device 100 can be effectively incident through the incident surface 320.

The minimum distance D5 between the recess 315 and the first light output surface 330 may be a distance between the apex 21 of the recess 315 and the apex 31 of the first light output surface 330. The distance D5 may be 1.5 mm or less, e.g., in a range of 0.6 mm to 1 mm. When the distance D5 between the apex 21 of the recess 315 and the apex 31 of the first light output surface 330 exceeds 1.5 mm, the amount of light advancing toward the center region of the first light output surface 330 may increase, and therefore, a hot spot phenomenon may occur. When the distance D5 between the apex 21 of the recess 315 and the apex 31 of the first light output surface 330 is less than 0.6 mm, the rigidity of the center of the optical lens 300 may be weak. As the distance D5 between the apex 21 of the recess 315 and the apex 31 of the first light output surface 330 is formed in the above-described range, the path of light can be horizontally diffused around the center region even though the center region of the second light output surface 335 does not have a total reflection surface or a negative curvature. This means that as the apex 21 of the recess 315 becomes adjacent to the convex apex 31 of the first light output surface 330, the amount of light advancing in the lateral direction of the first light output surface 330 through the incident surface 320 can be increased. Thus, the amount of light diffusing in the lateral direction of the optical lens 300 can be increased.

The apex 21 of the recess 315 may be disposed more adjacent to the apex 31 as the center of the first light output surface 330 than a straight line horizontally extending from the third edge 35 of the second light output surface 335.

In the optical lens 300, the first light output surface 330 may have different curvature radii. The incident surface 320 may have different curvature radii. The centers of circles having the respective curvature radii of the first light output surface 330 and the incident surface 320 may be arranged under a horizontal straight line passing through the apex 21 of the incident surface. The centers of circles having the respective curvature radii of the first light output surface 330 and the incident surface 320 may be arranged in a region vertically overlapping with the optical lens 300.

Light paths of the optical lens 300 will be described with reference to FIG. 16. First light L1 incident through the incident surface 320 of the optical lens 300 in light emitted from the light emitting device 100 may be refracted to be emitted through the first light output surface 330. Also, second light L2 incident through the incident surface 320 in the light emitted from the light emitting device 100 may be emitted through the second light output surface 335.

Here, the incident angle of the first light L1 incident through the incident surface 320 with respect to the light axis Y0 may be defined as a first angle θ1, and the emission angle of the first light L1 emitted through the first light output surface 330 with respect to the light axis Y0 may be defined as a second angle θ2. The incident angle of the second light L2 incident through the incident surface 320 with respect to the light axis Y0 may be defined as a third angle θ3, and the emission angle of the second light L1 emitted through the second light output surface 335 with respect to the light axis Y0 may be defined as a fourth angle θ4. The second light L2 may be light emitted through a side surface of the light emitting device 100.

The second angle θ2 is greater than the first angle θ1. The second angle θ2 is gradually increased as the first angle θ1 is gradually increased, and is gradually decreased as the first angle θ1 is gradually decreased. In addition, the first and second angles θ1 and θ2 satisfy a condition of θ2>θ1 or 1<(θ2/θ1). The second angle θ2 of the first light output surface 330 is an emission angle after the first light L1 is refracted, and may be greater than the incident angle before the first light L1 is refracted. Accordingly, the first light output surface 330 refracts the first light L1 advancing toward the first light output surface 330 in the light incident through the incident surface 320, so that the first light L1 can be diffused in the lateral direction of the optical lens 300.

The fourth angle θ4 may be smaller than the third angle θ3. The fourth angle θ4 is increased as the third angle θ3 is increased, and is decreased as the third angle θ3 is decreased. In addition, the third and fourth angles θ3 and θ4 satisfy a condition of θ4<θ4 or 1>(θ4/θ3). The fourth angle θ4 of the second light output surface 335 is an emission angle after the second light L2 is refracted, and may be smaller than the incident angle before the second light L2 is refracted. Light emitted through the side surface S2 of the light emitting device 100 or light out of a directional angular distribution of light may be incident through the second light output surface 335. Accordingly, the second light output surface 335 can refract the light emitted through the side surface S2 of the light emitting device 100 and the light out of the directional angular distribution to advance within a half angle of the brightness distribution. Thus, light loss can be reduced by the second light output surface 335.

The third edge 35 of the second light output surface 335 may be disposed above the position of the half angle of the directional angular distribution of the light emitting device 100, e.g., the fourth angle θ4 with respect to the light axis Y0. For example, the angle between the light axis Y0 and a straight line connecting the third edge 35 from a reference point P0 may be smaller than the half angle of the light emitting device 100. Here, the half angle refers to an angle at which the output of light emitted from the light emitting device 100 becomes 50% of ½ of the peak value with respect to the light axis Y0.

Light irradiated onto a region adjacent to the half angle in the light emitted from the light emitting device 100 may be controlled to be emitted through the second light output surface 335. In this case, the second light L2 emitted through the second light output surface 335 may be mixed with light advancing toward the first light output surface 330.

Here, the reference point P0 may be an intersection point of the light axis Y0 and the light emitting device 100. The reference point P0 may be disposed below the top surface S1 of the light emitting device 100. The reference point P0 of the light emitting device 100 may be a point at which the center of the top surface S1 and the center of the plurality of side surfaces S2 intersect each other or a point at which the center of the top surface S1 and the lower center of each side surface S2 intersect each other. The reference point P0 may be an intersection point at which the light axis Y0 and light emitted from the light emitting device 100 intersect each other. The reference point P0 may be disposed on the same horizontal line as the bottom point of the optical lens 300, or may be disposed above the bottom point of the optical lens 300.

Light L3 incident through the incident surface 320 in the light emitted from the light emitting device 100 is reflected by the bottom surface 310 of the optical lens 300 and may be emitted through the second light output surface 335 or reflected from the second light output surface 335. The light reflected by the second light output surface 335 is again incident through the incident surface 320 and then refracted, to be emitted through the first light output surface 330.

Light emitted through the second light output surface 335 in the light emitted through the side surfaces S2 of the light emitting device 100 is emitted with an emission angle smaller than the incident angle. Thus, as shown in FIG. 20, the distance G2 between optical lenses 300 disposed on different circuit boards 400, i.e., the light interference distance can be increased. Further, the brightness distribution of the optical lens 300 is improved, and thus the distance H1 between the circuit board 400 and an optical sheet 514 can be decreased. Furthermore, the number of optical lenses 300 arranged in the backlight unit can be decreased.

The first edge 23 of the bottom surface 310 in the optical lens 300 may be disposed at a position equal to or lower than the reference point P0 of the light emitting device 300, and the second edge 25 of the bottom surface 310 in the optical lens 300 may be disposed higher than the top surface S1 of the light emitting device 100. However, the present disclosure is not limited thereto. Accordingly, the bottom surface 310 totally reflects light that is incident through the incident surface 320 and emitted through the side surfaces S2 of the light emitting device 100.

As the center region of the first light output surface 330 vertically overlapping with the recess 315 is processed to have a flat or concave surface, a hot spot may occur due to light transmitted into the center region of the first light output surface 330 when the depth (D2 of FIG. 18) of the recess 315. In the embodiment, the depth D2 of the recess 315 is formed such that the recess 315 is adjacent to the convex center region of the first light output surface 330. Thus, light can be refracted in a lateral direction by the incident surface 320 of the recess 315. Accordingly, it is possible to reduce the hot spot caused by the light emitted through the first light output surface 330 of the optical lens 300.

As shown in FIG. 16, the angle θ5 between the top surface of the circuit board 400 and a line horizontal to the bottom surface 310 of the optical lens 300 or a line connecting both the edges 23 and 25 with respect to the light axis Y0 may be within 5 degrees, for example, in a range of 0.5 to 4 degrees. As the bottom surface 310 is formed as a surface or curved surface having an inclined angle θ5, light incident through the side surface S2 of the light emitting device 100 is reflected to be transmitted or reflected through the second light output surface 335. As the emission angle of the second light output surface 335 is smaller than the incident angle of light incident through the bottom surface 310, it is possible to reduce interference between optical lenses 300 disposed on adjacent circuit boards. Accordingly, it is possible to improve the amount of light emitted through the second light output surface 335 of the optical lens 300.

In addition, the distance from the bottom surface 310 to the straight line between the second and third edges 25 and 35 may be smaller than the depth D2 of the recess 315. That is, the depth (D2 of FIG. 16) of the recess 315 is deeply formed, thereby improving the diffusion of light in the lateral direction.

The optical lens 300 may be provided with an uneven surface formed at the second light output surface 335. The uneven surface may be formed as a rough haze surface. The uneven surface may be a surface in which scattering particles are formed.

The bottom surface 310 of the optical lens 300 may be provided with an uneven surface. The uneven surface may be formed as a rough haze surface. The uneven surface may be a surface in which scattering particles are formed.

When an uneven surface is formed at the second light output surface 335 and the bottom surface 310 of the optical lens 300, light incident through the incident surface 320 may be totally reflected by the bottom surface 310. The second light output surface 335 reflects a portion of the incident light. The reflected light may be again incident through the incident surface 320 to be refracted, or may be directly incident through the first light output surface 330. Here, the amount of the light incident through the incident surface 320 in the light reflected by the second light output surface 335 may be greater than the amount of the light incident through the first light output surface 330. The light again incident through the incident surface 320 may be refracted to be emitted through the first light output surface 330 or the second light output surface 335.

Meanwhile, the outer surface of the side protruding part 360 of the optical lens 300 may be formed as a rough surface. Here, the rough surface may have a surface roughness higher than that of the first light output surface. The rough surface may have a transmittance lower than that of the first light output surface. The rough surface may be a cutting surface.

The side protruding part 360 of the optical lens 300 protrudes from the second light output surface 335 as shown in FIGS. 15 and 17. Light incident into the region of the side protruding part 360 is reflected from the side protruding part 360 to be emitted through the outer surface of the side protruding part 360. In the optical lens 300 on the circuit board 400, light transmitted to the side protruding part 360 advances in the direction of the second axis Z1, in which different circuit boards 400 are arranged, so that it is possible to prevent light interference between optical lenses 300 on the same circuit board 400. Further, the distance between different circuit boards 400 is formed to be more distant than the distance between optical lenses 300 on the same circuit board 400, so that it is possible to reduce light interference between the optical lenses 300 on the different circuit boards 400.

The side protruding part 360 may protrude to, as a minimum thickness T1, a thickness of 300 μm, e.g., 500 μm or more. The side protruding part 360 is disposed in a direction in which the distance between optical lenses 300 is distant, thereby reducing light interference between the optical lenses 300.

The height T2 of the side protruding part 360 may be equal to or smaller than the thickness (D7 of FIG. 18) of the second light output surface 335. For example, the height T2 of the side protruding part 360 may be 1 mm or higher. The height T2 of the side protruding part 360 may be changed depending on a size of the optical lens 300. The height T2 of the side protruding part 360 may be at least ⅓ of the thickness (D3 of FIG. 18) of the optical lens 300.

The width (T3 of FIG. 2) of the side protruding part 360 may be greater than the height T2 or the thickness T1. For example, the width T3 of the side protruding part 360 may be two times or more greater than the height T2 or the thickness T1. The width T3 of the side protruding part 360 may be at least ⅓ of the width or diameter D4 of the optical lens 300.

FIGS. 19 and 20 are views showing a light unit having a lighting module according to an embodiment.

Referring to FIGS. 19 and 20, the light unit includes a bottom cover 512 and a lighting module 301 in the bottom cover 512. The lighting module 301 includes a plurality of circuit boards 400, light emitting devices 100, and optical lenses 300 arranged on the plurality of circuit boards 400. The plurality of circuit boards 400 may be arranged in the bottom cover 512.

The bottom cover 512 may include a metal or thermal conductive resin for heat dissipation. The bottom cover 512 may be provided with an accommodating part, and side covers may be provided around the accommodating part.

The circuit board 400 may include a circuit layer electrically connected to the light emitting device 100. The circuit board 400 may include at least one of a resin PCB, an MCPCB, and an FPCB, but the present disclosure is not limited thereto. According to an embodiment, a reflective sheet may be disposed on the circuit board. The reflective sheet may be formed of PET resin, PC resin, PVC resin, etc., but the present disclosure is not limited thereto.

An optical sheet 514 may be disposed over the bottom cover 512. The optical sheet 514 may include at least one of prism sheets for collecting distributed light, a brightness reinforcing sheet, and a diffusion sheet for re-diffusing light. A light guide layer (not shown) may be disposed in a region between the optical sheet 514 and the lighting module, but the present disclosure is not limited thereto.

The distance G1 between optical lenses 300 arranged on each of the plurality of circuit boards 400 may be narrower than the distance G2 between optical lenses 300 arranged on different circuit boards 400. The distance G1 may be formed in a range of six to ten times, e.g., six to nine times of the width or diameter D4 of the optical lens 300. The distance G2 may be formed in a range of nine to eleven times, e.g., nine to ten times of the width or diameter D4 of the optical lens 300. Here, the width D4 of the optical lens 300 may be 15 mm or more. The light interference distance between the optical lenses 300, i.e., the distances G1 and G2 may be at least six times of the width or diameter D4 of the optical lens 300.

When the width or diameter D4 of the optical lens 300 is narrower than the above-described range, the number of optical lenses 300 in the light unit may be increased, and darkness may be generated in a region between the optical lenses 300. When the width or diameter D4 of the optical lens 300 is wider than the above-described range, the number of optical lenses 300 in the light unit is decreased, but the brightness of each optical lens 300 may be decreased.

The optical lenses 300 in the light unit may be arranged such that their number is equal to that of side protruding parts 360.

The following Tables 1 and 2 show examples of distances between optical lenses 300 on the circuit board 400.

TABLE 1

| Model | Configuration (A × B) | G1 (mm) | G2 (mm) |
|---|---|---|---|
| 32 inches | 5 × 2 | 130 | 160 |
| 43 inches | 8 × 3 | 98~115 | 147 |
| 49 inches | 9 × 4 | 110 | 140 |

TABLE 2

| Model | Configuration (A × B) | G1 (mm) | G2 (mm) |
|---|---|---|---|
| 32 inches | 7 × 2 | 85 | 170 |
| 43 inches | 9 × 3 | 95 | 162 |
| 49 inches | 8 × 4 | 125 | 140 |

In Tables 1 and 2, A denotes a number of optical lenses arranged on one circuit board, and B denotes a number of columns of circuit boards. Here, G2 may be 1.1 to 2 times greater than G1, and may be changed depending on a number of optical lenses mounted on the circuit board and a size of a display device.

Also, G1 may be the same distance, or may be changed on the same circuit board.

FIG. 21 shows another example of the light unit of FIG. 20.

Referring to FIG. 21, a plurality of circuit boards 400, 400D, and 400E disposed in a bottom cover 512 may be arranged such that the distance between a first circuit board 400 and a second or third circuit board 400D or 400E at a center side is different from that between the first circuit board 400 and the second or third circuit board 400D or 400E at an edge side.

For example, the distance between the second and third circuits 400D and 400E disposed in different columns from the first circuit board 400 may be gradually increased as it is distant in the direction of a first axis from the center of the bottom cover 512.

The distance between optical lenses 300 mounted on the first to third circuit boards 400, 400D, and 400E may be gradually increased as it reaches from the center (B1) to the outside (B2) of the bottom cover 512.

In each of the optical lenses 300 arranged on the first to third circuit boards 400, 400D, and 400E, the side protruding parts 360 protrudes outward of a side surface of each of the circuit boards 400, 400D, and 400E, thereby reducing light interference between adjacent optical lenses 300.

FIG. 22 is a view showing another example of the optical lens in the lighting module according to an embodiment.

Referring to FIG. 22, the top-view shape of an optical lens 300B includes an elliptical shape. The optical lens 300B may have a width D9 in the direction of a second axis Z1, which is wider than a width D10 in the direction of a first axis X1. A side protruding part 360 of the optical lens 300B may protrude in the direction of the second axis Z1. The distance between elliptical optical lenses 300B in the direction of the first axis X1 may be adjusted, and the distance between elliptical optical lenses 300B in the direction of the second axis Z1 may be formed equal to or greater than the distance between elliptical optical lenses 300B in the direction of the first axis X1.

FIG. 24 is a view showing a first example of a light emitting device 100 according to an embodiment. The light emitting device 100 and a circuit board 400 will be described with reference to FIG. 24.

Referring to FIG. 24, the light emitting device 100 includes a light emitting chip 100A. The light emitting device 100 may include the light emitting chip 100A and a phosphor layer 150 disposed over the light emitting chip 100A. The phosphor layer 150 includes at least one or a plurality of blue, green, yellow, and red phosphors, and may be disposed in a single layer or multiple layers. The phosphor layer 150 may be formed by adding a phosphor into a transparent resin. The transparent resin includes a material such as silicon or epoxy, and the phosphor may be formed of at least one selected from YAG, TAG, silicate, nitride, and oxynitride-based materials.

The phosphor layer 150 may be disposed on a top surface of the light emitting chip 100A, or may be disposed on the top surface and side surfaces of the light emitting chip 100A. The phosphor layer 150 may be disposed on a region through which light is emitted among the surfaces of the light emitting chip 100A, to convert the wavelength of the light.

The phosphor layer 150 may include a single layer or different phosphor layers. As an example, the different phosphor layers may include a first layer and a second layer formed on the first layer. Here, the first layer may have at least one kind of phosphor among red, yellow, and green phosphors, and the second layer may have a different phosphor from the first layer among the red, yellow, and green phosphors. As another example, the different phosphor layer may include three or more phosphor layers, but the present disclosure is not limited thereto.

The phosphor layer 150 may include a film-type phosphor layer. The film-type phosphor layer is provided with a uniform thickness, so that it is possible to provide a uniform color distribution according to wavelength conversion.

The light emitting chip 100A will be described. The light emitting chip 100A may include a substrate 111, a semiconductor layer 113, a light emitting structure 120, an electrode layer 131, an insulating layer 133, a first electrode 135, a second electrode 137, a first connection electrode 141, a second connection electrode 143, and a support layer 140.

The substrate 111 may be a transparent, insulative, or conductive substrate, and may include, for example, at least one of sapphire ($Al_2O_3$), SiC, Si, GaAs, GaN, ZnO, Si, GaP, InP, Ge, and $Ga_2O_3$. A plurality of convex parts (not shown) are formed on at least one or both of the top and bottom surfaces of the substrate 111, to improve light extraction efficiency. The side sectional shape of each block part may include at least one of a hemispherical shape, a hemi-elliptical shape, and a polygonal shape. Here, the substrate 111 may be removed in the light emitting chip 100A. In this case, the first semiconductor layer 113 or a first conductive type semiconductor layer 115 may be disposed as a top layer of the light emitting chip 100A.

The first semiconductor layer 113 may be formed under the substrate 111. The semiconductor layer 113 may be formed using a compound semiconductor using Group II to V elements. The first semiconductor layer 113 may be formed in at least one layer or a plurality of layers using a compound semiconductor using Group II to V elements. The first semiconductor layer 113 may be a semiconductor layer using a compound semiconductor including, for example, Group III-V elements, and may include, for example, at least one of GaN, InN, AlN, InGaN, AlGaN, InALGaN, AlInN, AlGaAs, GaP, GaAs, GaAsP, and AlGaInP. The first semiconductor layer 113 has a compositional formula of $In_xAl_yGa_{1-x-y}N$ ($0 \leq x \leq 1$, $0 \leq y \leq 1$, $0 \leq x+y \leq 1$), and may be formed of at least one of a buffer layer and an undoped semiconductor layer. The buffer layer can reduce a difference in lattice constant between the substrate and a nitride semiconductor, and the undoped semiconductor layer can improve the crystal quality of a semiconductor. Here, the first semiconductor layer 113 may not be formed.

The light emitting structure 120 may be formed under the first semiconductor layer 113. The light emitting structure 120 may be formed of at least selected from compound semiconductors including Group II to V elements and Group III-V elements, and may emit light having a predetermined peak wavelength in a range from an ultraviolet band to a visible band.

The light emitting structure 120 includes the first conductive type semiconductor layer 115, a second conductive type semiconductor layer 119, and an active layer 117 formed between the first and second conductive type semiconductor layers 115 and 117. Another semiconductor layer may be further disposed on at least one of the top and bottom of each of the layers 115, 117, and 119, but the present disclosure is not limited thereto.

The first conductive type semiconductor layer 115 is disposed under the first semiconductor layer 113, and may be implemented as a semiconductor layer doped with a first conductive type dopant, e.g., an n-type semiconductor layer. The first conductive type semiconductor layer 115 includes a compositional formula of $In_xAl_yGa_{1-x-y}N$ ($0 \leq x \leq 1$, $0 \leq y \leq 1$, $0 \leq x+y \leq 1$). The first conductive type semiconductor layer 115 may be formed of at least one selected from compound semiconductors including Group III-V elements, e.g., GaN, AlN, AlGaN, InGaN, InN, InAlGaN, AlInN, AlGaAs, GaP, GaAs, GaAsP, and AlGaInP. The first conductive type dopant is an n-type dopant, and includes a dopant such as Si, Ge, Sn, Se, or Te.

The active layer 117 is disposed under the first conductive type semiconductor layer 115, and includes at least one selected from a single quantum well (MQW) structure, a quantum wire structure, and a quantum dot structure. The active layer 117 includes a period of a well layer and a barrier layer. The period of the well layer and the barrier layer includes, for example, at least one of pairs of InGaN/GaN, GaN/AlGaN, AlGaN/AlGaN, InGaN/AlGaN, InGaN/InGaN, AlGaAs/GaAs/InGaAs/GaAs, InGaP/GaP, AlInGaP/InGaP, and InP/GaAs.

The second conductive type semiconductor layer 119 is disposed under the active layer 117. The second conductive type semiconductor layer 119 includes a semiconductor doped with a second conductive type dopant, e.g., a compositional formula of $In_xAl_yGa_{1-x-y}N$ ($0 \leq x \leq 1$, $0 \leq y \leq 1$, $0 \leq x+y \leq 1$). The second conductive type semiconductor layer 119 may be made of at least one of compound semiconductors such as GaN, InN, AlN, InGaN, AlGaN, InAlGaN, AlInN, AlGaAs, GaP, GaAs, GaAsP, and AlGaInP. The second conductive type semiconductor layer 119 is a p-type semiconductor layer, and the second conductive type dopant is a p-type dopant. The second conductive type dopant may include Mg, Zn, Ca, Sr, and Ba.

As another example of the light emitting structure 120, the first conductive type semiconductor layer 115 may be implemented as a p-type semiconductor layer, and the second conductive type semiconductor layer 119 may be implemented as an n-type semiconductor layer. A third conductive type semiconductor layer having the opposite polarity to the second conductive type semiconductor layer 119 may be formed on the second conductive type semiconductor layer 119. In addition, the light emitting structure 120 may be implemented in any one of an n-p junction structure, a p-n junction structure, an n-p-n junction structure, and a p-n-p junction structure.

The electrode layer 131 is formed under the second conductive type semiconductor layer 119. The electrode layer 131 may include a reflective layer. The electrode layer 131 may include an ohmic contact layer contacted with the second conductive type semiconductor layer 119 of the light emitting structure 120. The reflective layer may include a material having a reflexibility of 70% or more, e.g., at least one selected from a metal such as Al, Ag, Ru, Pd, RH, Pt, or Ir and an alloy of two or more thereof. The metal of the reflective layer may be contacted with the second conductive type semiconductor layer 119 under the second conductive type semiconductor layer 119. The ohmic contact layer may be formed of at least one selected from a transparent material, a metallic material, and a nonmetallic material.

The electrode layer 131 may include a stack structure of a transparent electrode layer/a reflective layer. The transparent electrode layer may be formed of, for example, at least one selected from the group consisting of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), Ag, Ni, Al, Rh, Pd, Ir, Ru, Mg, Zn, Pt, Au, Hf, and combinations thereof. A reflective layer made of a metal may be disposed under the transparent electrode layer, and may be formed of, for example, at least one selected from the group consisting of Ag, Ni, Al, Rh, Pd, Ir, Ru, Mg, Zn, Pt, Au, Hf, and combinations thereof. As another example, the reflective layer may be formed into a distributed Bragg reflection (DBR) structure in which two layers having different refractive indices are alternatively stacked.

A light extraction structure such as roughness may be formed on the surface of at least one of the second conductive type semiconductor layer 119 and the electrode layer 131. The light extraction structure changes the critical angle of incident light, thereby improving light extraction efficiency.

The insulating layer 133 is disposed under the electrode layer 131, and may be disposed at a bottom surface of the second conductive type semiconductor layer 119, side surfaces of the second conductive type semiconductor layer 119 and the active layer 117, and a partial region of the first conductive type semiconductor layer 115. The insulating layer 133 is formed in a region excluding the electrode layer 131, the first electrode 135, and the second electrode 137 in a lower region of the light emitting structure 120, to electrically protect a lower portion of the light emitting structure 120.

The insulating layer 133 includes an insulating material or insulative resin formed of at least one of oxide, nitride, fluoride, and sulfide, which have at least one of Al, Cr, Si, Ti, Zn, and Zr. The insulating layer 133 may be formed of, for example, at least one of $SiO_2$, $Si_3N_4$, $Al_2O_3$, and $TiO_2$. The insulating layer 133 may be formed in a single layer or multiple layers, but the present disclosure is not limited thereto. The insulating layer 133 is formed to prevent an interlayer short circuit of the light emitting structure 120 when a metal structure for flip bonding is formed under the light emitting structure 120.

The insulating layer 133 may be formed into a DBR structure in which first and second layers having different refractive indices are alternately stacked. The first layer may be formed of any one of $SiO_2$, $Si_3N_4$, $Al_2O_3$, and $TiO_2$, and the second layer may be formed of any one of the other materials except the material forming the first layer. However, the present disclosure is not limited thereto. Alternatively, the first and second layers may be formed of the same material, or may be formed as a pair having three or more layers. In this case, the electrode layer may not be formed.

The first electrode 135 may be disposed under a partial region of the first conductive type semiconductor layer 115, and the second electrode 137 may be disposed under a portion of the electrode layer 131. The first connection electrode 141 is disposed under the first electrode 135, and the second connection electrode 143 is disposed under the second electrode 137.

The first electrode 135 may be electrically connected to the first conductive type semiconductor layer 115 and the first connection electrode 141, and the second electrode 137 may be electrically connected to the second conductive type semiconductor layer 119 and the second connection electrode 143.

Each of the first electrode 135 and the second electrode 137 may be formed of at least one of Cr, Ti, Co, Ni, V, Hf, Ag, Al, Ru, Rh, Pt, Pd, Ta, Mo, and W, or alloy thereof. Each of the first electrode 135 and the second electrode 137 may be formed in a single layer or multiple layers. The first electrode 135 and the second electrodes 137 may be formed into the same stack structure or different stack structures. At least one of the first electrode 135 and the second electrode 137 may be further provided with a current diffusion pattern such as an arm or finger structure. Also, each of the first and second electrodes 135 and 137 may be formed in one or plurality, but the present disclosure is not limited thereto. At least one of the first and second connection electrodes 141 and 143 may be disposed in plurality, but the present disclosure is not limited thereto.

The first and second connection electrodes 141 and 143 provide a lead function of supplying power and a heat dissipation path. The first and second connection electrodes 141 and 143 may include at least one of a circular shape, a polygonal shape, and a shape such as a circular post or a polygonal post. The first connection electrode 141 and the second connection electrode 143 may be formed of a metal powder material, e.g., at least one selected from Ag, Al, Au, Cr, Co, Cu, Fe, Hf, In, Mo, Ni, Si, Sn, Ta, Ti, W, and alloy thereof. The first and second connection electrodes 141 and 143 may be plated with at least one selected from In, Sn, Ni, Cu, and alloy thereof so as to improve adhesion with the respective first and second electrodes 135 and 137.

The support layer 140 includes a thermal conductive material, and may be disposed around the first and second connection electrodes 141 and 143. Bottom surfaces of the first and second electrodes 141 and 143 may be exposed to a bottom surface of the support layer 140.

The support layer 140 is used as a layer for supporting the light emitting device 100. The support layer 140 is formed of an insulative material, and the insulative material may be formed of resin such as silicon or epoxy. As another example, the insulative material may include polyacrylate resin, epoxy resin, phenolic resin, polyamides resin, polyimides rein, unsaturated polyesters resin, polyphenylene ether resin (PPE), polyphenilene oxide resin (PPO), polyphenylenesulfides resin, cyanate ester resin, benzocyclobutene (BCB), Polyamido-amine Dendrimers (PA-MAM), and Polypropylene-imine, Dendrimers (PPI), and PAMAM-OS that is a dendrimer having an inner structure of PAMAM and an outer structure of organo-silicon, alone or in a combination thereof. The support layer 140 may be formed of a different material from the insulating layer 133.

At least one of compounds such as oxide, nitride, fluoride, and sulfide, which have at least one of Al, Cr, Si, Ti, Zn, and Zr, may be added into the support layer 140. Here, the compound added into the support layer 140 may be a heat-dispersion agent. The heat-dispersion agent may be used as a powder particle having a predetermined size, grain, filler, or additive. The heat-dispersion agent includes a ceramic material, and the ceramic material may include at least one of low temperature co-fired ceramic (LTCC), high temperature co-fired ceramic (HTCC), alumina, quartz, calcium zirconate, forsterite, SiC, graphite, fused silica, mullite, cordierite, zirconia, beryllia, and aluminum nitride. The ceramic material may be formed of metal nitride having a higher thermal conductivity than nitride and oxide among insulative materials such as the nitride and the oxide. The metal nitride may include, for example, a material having a thermal conductivity equal to or higher than 140 W/mK. The ceramic material may include ceramic-based materials, such as $SiO_2$, $Si_xO_y$, $Si_3N_4$, $Si_xN_y$, $SiO_xN_y$, $Al_2O_3$, BN, $Si_3N_4$, SiC (SiC—BeO), BeO, CeO, and AlN. The thermal conductive material may include C (diamond or CNT) component.

The light emitting chip 100A is mounted in a flip manner on the circuit board 400. The circuit board 400 includes a metal layer 417, an insulating layer 472 on the metal layer 471, a circuit layer (not shown) having a plurality of lead electrodes 473 and 474 on the insulating layer 472, and a protective layer 475 for protecting the circuit layer. The metal layer 471 is a heat dissipation layer, and may include a metal having a high thermal conductivity, e.g., a metal such as Cu or Cu-alloy. The metal layer 471 may be formed into a single-layered or multi-layered structure.

The insulating layer 472 insulates between the metal layer 471 and the circuit layer. The insulating layer 472 may include at least one of resin materials such as epoxy, silicon, glass fiber, prepreg, polyphthalamide (PPA), liquid crystal polymer (LCP), and polyamide9T (PA9T). In addition, a metal oxide, e.g., an additive such as $TiO_2$, $SiO_2$, or $Al_2O_3$, may be added into the insulating layer 472, but the present disclosure is not limited thereto. As another example, the insulating layer 472 may be used by adding a material such as graphene into an insulative material such as silicon or epoxy, but the present disclosure is not limited thereto.

The insulating layer 472 may be an anodized region formed by anodizing the metal layer 471. Here, the metal layer 471 may be formed of a material such as aluminum, and the anodized region may be formed of a material such as $Al_2O_3$.

The first and second lead electrodes 473 and 474 are electrically connected to the first and second connection electrodes 141 and 143 of the light emitting chip 100A, respectively. Conductive adhesives 461 and 462 may be disposed between the first and second lead electrodes 473 and 474 and the first and second connection electrodes 141 and 143, respectively. The conductive adhesives 461 and 463 may include a metallic material such as a solder material. The first and second lead electrodes 473 and 474 are circuit patterns, and supply power.

The protective layer 475 may be disposed on the circuit layer. The protective layer 475 includes a reflective material. For example, the protective layer 475 may be formed of a resist material, e.g., a white resist material, but the present disclosure is not limited thereto. The protective layer 475 may serve as a reflective layer, and may be formed of, for example, a material having a high reflexibility as compared with absorptance. As another example, the protective layer 475 may be formed of a light absorbing material absorbing light, and the light absorbing material may include a black resist material.

A second example of the light emitting device of the lighting module will be described with reference to FIG. 25.

Referring to FIG. 25, the light emitting device 100 includes a light emitting chip 100B. The light emitting device 100 may include the light emitting chip 100B and a phosphor layer 150 disposed over the light emitting chip 100B. The phosphor layer 150 includes at least one or a plurality of blue, green, yellow, and red phosphors, and may be disposed in a single layer or multiple layers. The phosphor layer 150 may be formed by adding a phosphor into a transparent resin. The transparent resin includes a material such as silicon or epoxy, and the phosphor may be formed of at least one selected from YAG, TAG, silicate, nitride, and oxynitride-based materials.

The phosphor layer 150 may be disposed on a top surface of the light emitting chip 100B, or may be disposed on the top surface and side surfaces of the light emitting chip 100B. The phosphor layer 150 may be disposed on a region through which light is emitted among the surfaces of the light emitting chip 100B, to convert the wavelength of the light.

The light emitting chip 100B may include a substrate 111, a first semiconductor layer 113, a light emitting structure 120, an electrode layer 131, an insulating layer 133, a first electrode 135, a second electrode 137, a first connection electrode 141, a second connection electrode 143, and a support layer 140. The substrate 111 and the second semiconductor layer 113 may be removed.

The light emitting chip 100B of the light emitting device 100 and a circuit board 400 may be connected through connection electrodes 161 and 162, and the connection electrodes 161 and 162 may include conductive bumps, i.e., solder bumps. The conductive bump may be disposed in one or plurality under each of the first and second electrodes 135 and 137, but the present disclosure is not limited thereto. The insulating layer 133 may expose the first and second electrodes 135 and 137 therethrough, and the first and second electrodes 135 and 137 may be electrically connected to the connection electrodes 161 and 162, respectively.

A third example of the light emitting device will be described with reference to FIG. 26.

Referring to FIG. 26, the light emitting device 100 includes a light emitting chip 200A connected to a circuit board 400. The light emitting device may include a phosphor layer 250 disposed over surfaces of the light emitting chip 200A. The phosphor layer 250 converts the wavelength of incident light. An optical lens (300 of FIG. 4) is disposed over the light emitting device 100 as shown in FIG. 4 to adjust directivity characteristics of light emitted from the light emitting chip 200A.

The light emitting chip 200A includes a light emitting structure 225 and a plurality of pads 245 and 247. The light emitting structure 225 may be formed of compound semiconductor layers including Group II to VI elements, e.g., compound semiconductor layers including Group III-V elements or compound semiconductor layers including Group II-VI elements. The plurality of pads 245 and 247 are selectively connected to the semiconductor layers of the light emitting structure 225, and supply power.

The light emitting structure 225 includes a first conductive type semiconductor layer 222, an active layer 223, and a second conductive type semiconductor layer 224. The light emitting chip 20A may include a substrate 221. The substrate 221 is disposed on the light emitting structure 225. The substrate 221 may be, for example, a transparent substrate, an insulative substrate, or a conductive substrate. The configuration will refer to the description of the light emitting structure and the substrate of FIG. 4.

The pads 245 and 247 are disposed under the light emitting chip 200A. The pads 245 and 247 include first and second pads 245 and 247. The first and second pads 245 and 247 are disposed to be spaced apart from each other under the light emitting chip 200A. The first pad 245 is electrically connected to the first conductive type semiconductor layer 222, and the second pad 247 is electrically connected to the second conductive type semiconductor layer 224. The first and second pads 245 and 247 may have a polygonal or circular bottom, and may be formed to respectively correspond to the shapes of first and second lead electrodes 415 and 417 of the circuit board 400. The areas of bottom surfaces of the first and second pads 245 and 24 may be formed to correspond to the sizes of top surfaces of the first and second lead electrodes 415 and 417, respectively.

The light emitting chip 200A may include at least one of a buffer layer (not shown) and an undoped semiconductor layer (not shown) between the substrate 221 and the light emitting structure 225. The buffer layer is a layer for reduce a difference in lattice constant between the substrate 221 and the semiconductor layer, and may be formed of at least one selected from Group II to VI compound semiconductor layers. An undoped Group III-V compound semiconductor layer may be further formed under the buffer layer, but the present disclosure is not limited thereto. The substrate 221 may be removed. When the substrate 221 is removed, the phosphor layer 250 may be contacted with a top surface of the first conductive type semiconductor layer 222 or a top surface of another semiconductor layer.

The light emitting chip 200A includes first and second electrode layers 241 and 242, a third electrode layer 243, and insulating layers 231 and 233. Each of the first and second electrode layers 241 and 242 may be formed in a single layer or multiple layers, and may serve as a current diffusion layer. The first and second electrode layers 241 and 242 may include a first electrode layer 241 disposed under the light emitting structure 225 and a second electrode layer 242 disposed under the first electrode layer 241. The first electrode layer 241 diffuses current, and the second electrode layer 242 reflects incident light.

The first and second electrode layers 241 and 242 may be formed of different materials from each other. The first electrode layer 241 may be formed of a transparent material, e.g., metal oxide or metal nitride. The first electrode layer 241 may be formed of at least one selected from indium tin oxide (ITO), ITO nitride (ITON), indium zinc oxide (IZO), IZO nitride (IZON), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO). The second electrode layer 242 is contacted with a bottom surface of the first electrode layer 241, and may serve as a reflective electrode layer. The second electrode layer 242 includes a metal, e.g., Ag, Au, or Al. When a partial region of the first electrode layer 241 is removed, the second electrode layer 242 may be partially contacted with a bottom surface of the light emitting structure 225.

As another example, the first and second electrode layers 241 and 242 may be stacked in an omni directional reflection layer (ODR) structure. The ODR structure may be a stack structure of the first electrode layer 241 having a low refractive index and the second electrode layer 242 made of a high-reflexibility metallic material, which is contacted with the first electrode layer 241. The first and second electrode layers 241 and 242 may be formed into a stack structure of ITO/Ag. Thus, it is possible to improve an omni directional reflecting angle at an interface between the first and second electrode layers 241 and 242.

As another example, the second electrode layer 242 may be removed, and may be formed as a reflective layer made of another material. The reflective layer may be formed into a DBR structure, and the DBR structure includes a structure in which two dielectric layers having different refractive indices are alternately stacked. The dielectric layers may include, for example, different layers among a SiO$_2$ layer, a Si$_3$N$_4$ layer, a TiO$_2$ layer, an Al$_2$O$_3$ layer, and a MgO layer. As another example, the first and second electrode layers 241 and 242 may include both of the DBR structure and the ODR structure. In this case, the light emitting chip 200A having a light reflexibility of 98% or more may be provided. In the light emitting chip 200A mounted in the flip manner, light reflected from the second electrode layer 242 is emitted through the substrate 221, and therefore, a majority of the light may be emitted in a vertical upward direction. Also, light emitted through side surfaces of the light emitting chip 200A may be reflected into the region of an incident surface of the optical lens 300.

The third electrode layer 243 is disposed under the second electrode layer 242. The third electrode layer 243 is electrically insulated from the first and second electrode layers 241 and 242. The third electrode layer 243 may include a metal, e.g., at least one of titanium (Ti), copper (Cu), nickel (Ni), gold (Au), chromium (Cr), tantalum (Ta), platinum (Pt), tin (Sn), silver (Ag), and a phosphorus (P). The first and second pads 245 and 247 are disposed under the third electrode layer 243. The insulating layers 231 and 233 prevent unnecessary contact between the first and second electrode layers 241 and 242, the third electrode layer 243, the first and second pads 245 and 247, and the layers of the light emitting structure 225. The insulating layers 231 and 233 include first and second insulating layers 231 and 233. The first insulating layer 231 is disposed between the third electrode layer 243 and the second electrode layer 242. The second insulating layer 233 is disposed between the third electrode layer 243 and the first and second pads 245 and 247. The first and second pads 245 and 247 may include the same material as the first and second lead electrodes 415 and 417.

The third electrode layer 243 is connected to the first conductive type semiconductor layer 222. A connection part 244 of the third electrode layer 243 protrudes in a via structure 226 through the first and second electrode layers 241 and 242 and a lower portion of the light emitting structure 225. The connection part 244 of the third electrode layer 243 is contacted with the first conductive type semiconductor layer 222. The connection part 244 may be disposed in plurality. A portion 232 of the first insulating layer 231 extends around the connection part 244 of the third electrode layer 243 to block electrical connection between the third electrode layer 243 and the first and second electrode layers 241, 242, the second conductive type semiconductor layer 224, and the active layer. An insulating layer for protecting side surfaces of the light emitting structure 225 may be disposed on the side surfaces of the light emitting structure 225, but the present disclosure is not limited thereto.

The second pad 247 is disposed under the second insulating layer 233. The second pad 247 is contacted with or connected to at least one of the first and second electrode layers 241 and 242 through an open region of the second insulating layer 233. The first pad 245 is disposed under the second insulating layer 233. The first pad 245 is connected to the third electrode layer 243 through an open region of the second insulating layer 233. Accordingly, a protrusion 248 of the second pad 247 is electrically connected to the second conductive type semiconductor layer 224 through the first and second electrode layers 241 and 242. A protrusion 246 of the first pad 245 is electrically connected to the first conductive type semiconductor layer 222 through the third electrode layer 243.

The first and second pads 245 and 247 are spaced apart from each other under the light emitting chip 200A. The first and second pads 245 and 247 are opposite to the first and second lead electrodes 415 and 417 of the circuit board 400, respectively. The first and second pads 245 and 247 may include polygonal recesses 271 and 273, respectively. The recesses 271 and 273 may be formed to have depths equal to or smaller than thicknesses of the first and second pads 245 and 247, respectively. The depths of the recesses 271 and 273 can increase surface areas of the first and second pads 245 and 247, respectively.

Adhesive members 255 and 257 are disposed in a region between the first pad 245 and the first lead electrode 415 and a region between the second pad 247 and the second lead electrode 417, respectively. The adhesive members 255 and 257 may include an electrical conductive material, and portion of the adhesive members 255 and 257 are disposed in the recesses 271 and 273, respectively. As the adhesive members 255 and 257 are respectively disposed in the recesses 271 and 273, the adhesion areas between and the adhesive members 255 and 257 and the first and second pads 245 and 247 can be increased. Accordingly, the first and second pads 245 and 247 are respectively adhered to the first and second lead electrodes 415 and 417, so that it is possible to improve the electrical reliability and heat dissipation efficiency of the light emitting chip 200A.

The adhesive members 255 and 257 may include a solder paste material. The solder paste may include at least one of gold (Au), annotation (Sn), lead (Pb), copper (Cu), bismuth (Bi), indium (In), and silver (Ag). Since the adhesive members 255 and 257 conduct heat directly to the circuit board 400, the heat transfer efficiency may further improve a structure using a package. Since the adhesive members 255 and 257 have a small difference in thermal expansion coefficient from the first and second pads 245 and 247 of the light emitting chip 200A, the heat conduction efficiency can be improved.

As another example, each of the adhesive members 255 and 257 may include a conductive film, and the conductive film includes one or more conductive particles in an insulated film. The conductive particle may include, for example, at least one of metal, metal alloy, and carbon. The conductive particle may include, for example, at least one nickel, silver, gold, aluminum, chromium, copper, and carbon. The conductive film may include an anisotropic conductive film or an anisotropic conductive adhesive.

An adhesive member, e.g., a thermal conductive film may be disposed between the light emitting chip 200A and the circuit board 400. The thermal conductive film may include a polyester resin such as polyethylene terephthalate, polybutylene terephthalate; a polyimide resin; an acrylic resin; a styrene-based resin such as polystyrene or acrylonitrile-styrene; a polycarbonate resin, a poly lactic acid resin; a polyurethane resin, and the like. Also, the thermal conductive film may include at least one of a polyolefin resin such as polyethylene, polypropylene, or ethylene-propylene copolymer; a vinyl resin such as polyvinyl chloride or polyvinylidene chloride; a polyamide resin; a sulfone-based resin; a polyether-etherketone-based resin; an arylate-based resin, and blends thereof.

The light emitting chip 200A emits light through the surface of the circuit board 400 and the side and top surfaces of the light emitting structure 225, thereby improving light extraction efficiency. Further, the light emitting chip 200A can be directly bonded on the circuit board 400, thereby simplifying processes. Furthermore, the heat dissipation of the light emitting chip 200A is improved, so that the light emitting chip 200A can be usefully applied in lighting fields, etc.

The light unit can be applied to various display devices such as portable terminals, monitors of notebook computers, monitors of laptop computers, and TVs, or can be applied to three-dimensional displays, various streetlights, signal lamps, vehicle headlights, and electronic display boards.

The features, structures, effects and the like described in the embodiments are included in at least one embodiment of the present invention, and are not necessarily limited to only one embodiment. Furthermore, the features, structures, effects and the like illustrated in the embodiments can be combined and modified by other persons skilled in the art to which the embodiments belong. Therefore, it is to be understood that the present invention is not limited to these embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

Embodiments can improve the reliability of the lighting module.

Embodiments can be applied to a display using a lighting module, various illumination lamps, a traffic light, a vehicle headlight, and an illumination device such as an electric signboard.

The invention claimed is:

1. A lighting module comprising:
a circuit board having a length in a direction of a first axis longer than a length in a direction of a second axis;
a plurality of optical lenses arranged in the direction of the first axis on the circuit board; and
at least one light emitting device respectively disposed between the circuit board and the plurality of optical lenses,
wherein the optical lens comprises:
an incident surface around the at least light emitting device disposed on a top surface of the circuit board;
a first light output surface upwardly emitting light incident through the incident surface;
a second light output surface emitting the incident light in a lateral direction; and
a side protruding part protruding outward from a first region of the second light output surface,
wherein the side protruding part of each of the optical lenses protrudes outward of the circuit board, and
wherein the side protruding part has a height smaller than a thickness of the second light output surface, and is disposed more adjacent to the first light output surface than the top surface of the circuit board.

2. A lighting module comprising:
a plurality of circuit boards, each of which length in a direction of a first axis is longer than that in a direction of a second axis;
a plurality of optical lenses arranged in the direction of the first axis on the plurality of circuit boards; and
at least one light emitting device respectively disposed between the circuit board and the plurality of optical lenses,
wherein the optical lens comprises:
an incident surface around the at least light emitting device disposed on a top surface of the circuit board;
a first light output surface upwardly emitting light incident through the incident surface;
a second light output surface emitting the incident light in a lateral direction; and
a side protruding part protruding outward from a first region of the second light output surface,
wherein the side protruding part of each of the optical lenses protrudes outward of a side of the circuit board,
the plurality of circuit boards comprise first and second circuit boards arranged in the direction of the second axis,
wherein a minimum distance between the second light output surface of the optical lens disposed on the first circuit board and the second light output surface of the optical lens disposed on the second circuit board is greater than a distance between the optical lenses arranged on each of the first and second circuit boards, and
wherein the side protruding part has a height smaller than a thickness of the second light output surface, and is disposed more adjacent to the first light output surface than the top surface of the circuit board.

3. The lighting module according to claim 1, wherein a straight line parallel to an outer side surface of the side protruding part is disposed in parallel to both sides of the circuit board.

4. The lighting module according to claim 1, wherein the side protruding part of each of the plurality of optical lenses protrudes outward of any one of first and second sides of the circuit board, and
the first and second sides of the circuit board are disposed in the direction of the second axis.

5. The lighting module according to claim 4, wherein the optical lens comprises a plurality of support protrusions protruding in a direction toward the top surface of the circuit board, and
a line connecting two support protrusions adjacent to the side protruding part among the plurality of support protrusions is disposed in the direction of the first axis.

6. The lighting module according to claim 5, wherein the optical lens comprises four support protrusions, and
wherein a number of the side protruding parts and a number of the optical lenses disposed on the circuit board are equal to each other.

7. The lighting module according to claim 5, wherein the plurality of support protrusions have the same distance from a light axis of the optical lens.

8. The lighting module according to claim 5, wherein the plurality of support protrusions are respectively disposed in first to fourth quadrants divided from the direction of the second axis passing through a center of a bottom of the optical lens and a center of a side protruding part and the direction of the first axis perpendicular to the second axis.

9. The lighting module according to claim 1, wherein the plurality of optical lenses are arranged in the directions of the first and second axes perpendicular to each other, and
the side protruding part of each of the optical lenses protrudes in the direction of the second axis.

10. The lighting module according to claim 1, wherein the outer side surface of the side protruding part has roughness, and
wherein a shape of the outer side surface of the side protruding part comprises a circular shape or a polygonal shape.

11. The lighting module according to claim 1, wherein the outer side surface of the side protruding part has a transmittance lower than that of the second light output surface.

12. The lighting module according to claim 5, wherein the plurality of support protrusions is disposed closer to an axis line among first and second axis lines perpendicular to each other from a center of the optical lens.

13. The lighting module according to claim 1, wherein at least one of the optical lenses arranged on the circuit board has the side protruding part protruding in a direction of the first or second side of the circuit board, and
wherein the first and second sides of the circuit board are disposed opposite to each other in the direction of the second axis.

14. The lighting module according to claim 1, wherein the optical lens comprises a recess convex from a bottom surface thereof,
the first light output surface has a spherical surface, and
the second light output surface has an aspherical surface.

15. The lighting module according to claim 14, wherein the recess has a depth that is 80% or more of a distance between a peak of the first light output surface and the bottom surface,
a region vertically overlapping with the recess in a region of the first light output surface comprises a curved surface convex in the same direction as the recess,
the second light output surface has an emission angle smaller than an incident angle of light incident through the incident surface, and
the bottom surface of the optical lens comprises a total reflection surface.

16. The lighting module according to claim 2, wherein a distance between the first and second circuit boards and the distance between the optical lenses arranged on the first and second circuit boards are gradually increased in the direction of the first axis, and
wherein a number of the side protruding parts and a number of the optical lenses disposed on the plurality of circuit boards are equal to each other.

17. The lighting module according to claim 2, wherein the side protruding parts of optical lenses arranged on an outermost circuit board among the plurality of circuit boards protrude in opposite directions relative to each other,
each of the optical lenses comprises a plurality of support protrusions protruding to the circuit board, and
any one of the plurality of support protrusions, which is adjacent to the side protruding part, has a different shape from other ones of the plurality of support protrusions.

18. The lighting module according to claim 2, wherein a straight line parallel to an outer side surface of the side protruding part is disposed in parallel to both sides of the circuit board,
wherein the side protruding part of each of the plurality of optical lenses protrudes outward of any one of first and second sides of the circuit board,
the first and second sides of the circuit board are disposed in the direction of the second axis,
wherein the optical lens comprises a plurality of support protrusions protruding in a direction toward the top surface of the circuit board, and
a line connecting two support protrusions adjacent to the side protruding part among the plurality of support protrusions is disposed in the direction of the first axis.

19. The lighting module according to claim 18, wherein at least one of the optical lenses arranged on the circuit board has the side protruding part protruding in a direction of the first or second side of the circuit board,
wherein between the first and second sides of the circuit board are disposed opposite to each other in the direction of the second axis,
wherein the optical lens comprises a recess convex from a bottom surface thereof,
the first light output surface has a spherical surface,
the second light output surface has an aspherical surface,
wherein the recess has a depth that is 80 or more of a distance between a peak of the first light output surface and the bottom surface,
a region vertically overlapping with the recess in a region of the first light output surface comprises a curved surface convex in the same direction as the recess,
the second light output surface has an emission angle smaller than an incident angle of light incident through the incident surface, and
the bottom surface of the optical lens comprises a total reflection surface.

* * * * *